(12) United States Patent
Happ et al.

(10) Patent No.: US 7,564,710 B2
(45) Date of Patent: Jul. 21, 2009

(54) CIRCUIT FOR PROGRAMMING A MEMORY ELEMENT

(75) Inventors: Thomas Happ, Tarrytown, NY (US); Jan Boris Philipp, Peekskill, NY (US); Ming-Hsiu Lee, Hsinchu (TW)

(73) Assignees: Qimonda North America Corp., Cary, NC (US); Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/742,090

(22) Filed: Apr. 30, 2007

(65) Prior Publication Data

US 2008/0266932 A1    Oct. 30, 2008

(51) Int. Cl.
G11C 11/00 (2006.01)
G11C 11/56 (2006.01)

(52) U.S. Cl. .................. 365/163; 365/148; 365/168
(58) Field of Classification Search .................. 365/163
See application file for complete search history.

(56) References Cited

U.S. PATENT DOCUMENTS

| | | | |
|---|---|---|---|
| 6,625,054 B2 * | 9/2003 | Lowrey et al. | 365/148 |
| 6,687,153 B2 | 2/2004 | Lowrey | |
| 7,031,181 B1 | 4/2006 | Happ | |
| 7,110,286 B2 | 9/2006 | Choi et al. | |
| 7,113,424 B2 | 9/2006 | Happ et al. | |
| 7,272,037 B2 * | 9/2007 | Lee et al. | 365/163 |
| 2004/0228159 A1 * | 11/2004 | Kostylev et al. | 365/148 |
| 2005/0195633 A1 | 9/2005 | Choi et al. | |
| 2006/0072357 A1 * | 4/2006 | Wicker | 365/163 |
| 2006/0077705 A1 * | 4/2006 | Kostylev et al. | 365/163 |
| 2006/0220071 A1 | 10/2006 | Kang et al. | |
| 2006/0249725 A1 * | 11/2006 | Lee | 257/4 |
| 2007/0008769 A1 * | 1/2007 | Kim et al. | 365/148 |
| 2007/0077699 A1 | 4/2007 | Gordon et al. | |
| 2007/0155093 A1 * | 7/2007 | Jeong et al. | 438/257 |
| 2007/0297221 A1 * | 12/2007 | Philipp et al. | 365/163 |
| 2008/0043522 A1 * | 2/2008 | Fuji et al. | 365/163 |

* cited by examiner

Primary Examiner—Son L Mai
(74) Attorney, Agent, or Firm—Dicke, Billig & Czaja, PLLC

(57) ABSTRACT

An integrated circuit includes a memory element configured to be programmed to any one of at least three resistance states and a circuit. The circuit is configured to program the memory element to a selected one of the at least three resistance states by applying a pulse to the memory element. The pulse includes one of at least three tail portions wherein each tail portion corresponds to one of the at least three resistance states.

29 Claims, 14 Drawing Sheets

CIRCUIT FOR PROGRAMMING A MEMORY ELEMENT

BACKGROUND

One type of memory is resistive memory. Resistive memory utilizes the resistance value of a memory element to store one or more bits of data. For example, a memory element programmed to have a high resistance value may represent a logic "1" data bit value and a memory element programmed to have a low resistance value may represent a logic "0" data bit value. Typically, the resistance value of the memory element is switched electrically by applying a voltage pulse or a current pulse to the memory element.

One type of resistive memory is phase change memory. Phase change memory uses a phase change material in the resistive memory element. The phase change material exhibits at least two different states. The states of the phase change material may be referred to as the amorphous state and the crystalline state, where the amorphous state involves a more disordered atomic structure and the crystalline state involves a more ordered lattice. The amorphous state usually exhibits higher resistivity than the crystalline state. Also, some phase change materials exhibit multiple crystalline states, e.g. a face-centered cubic (FCC) state and a hexagonal closest packing (HCP) state, which have different resistivities and may be used to store bits of data. In the following description, the amorphous state generally refers to the state having the higher resistivity and the crystalline state generally refers to the state having the lower resistivity.

Phase changes in the phase change materials may be induced reversibly. In this way, the memory may change from the amorphous state to the crystalline state and from the crystalline state to the amorphous state in response to temperature changes. The temperature changes of the phase change material may be achieved by driving current through the phase change material itself or by driving current through a resistive heater adjacent the phase change material. With both of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The level of current and/or voltage generally corresponds to the temperature induced within the phase change material in each memory cell.

To achieve higher density phase change memories, a phase change memory cell can store multiple bits of data. Multi-bit storage in a phase change memory cell can be achieved by programming the phase change material to have intermediate resistance values or states, where the multi-bit or multilevel phase change memory cell can be written to more than two states. If the phase change memory cell is programmed to one of three different resistance levels, 1.5 bits of data per cell can be stored. If the phase change memory cell is programmed to one of four different resistance levels, two bits of data per cell can be stored, and so on.

To program a phase change memory cell to an intermediate resistance value, the amount of crystalline material coexisting with amorphous material and hence the cell resistance is controlled via a suitable write strategy. The amount of crystalline material coexisting with amorphous material should be precisely controlled to ensure consistent resistance values for multi-bit storage. Consistent resistance values having a narrow distribution of the different resistance levels ensure that a sufficient sensing margin can be obtained.

For these and other reasons, there is a need for the present invention.

SUMMARY

One embodiment provides an integrated circuit. The integrated circuit includes a memory element configured to be programmed to any one of at least three resistance states and a circuit. The circuit is configured to program the memory element to a selected one of the at least three resistance states by applying a pulse to the memory element. The pulse includes one of at least three tail portions wherein each tail portion corresponds to one of the at least three resistance states.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
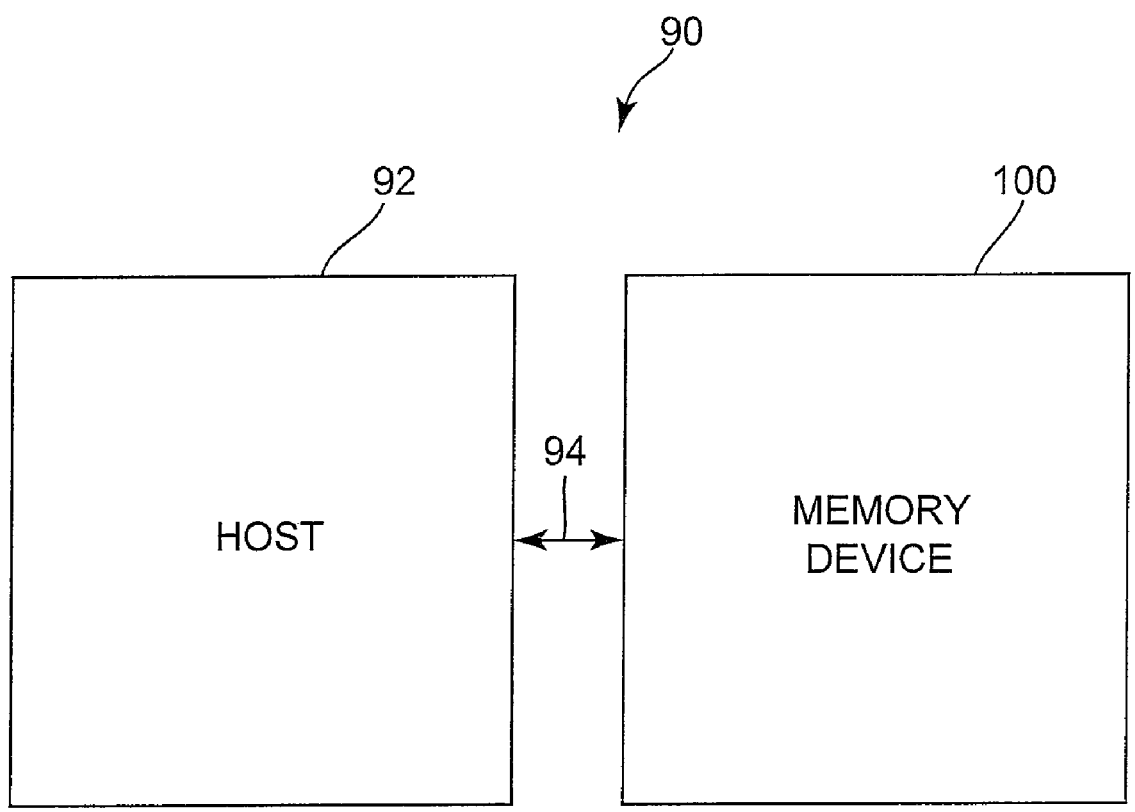
FIG. 1 is a block diagram illustrating one embodiment of a system.

FIG. 1 is a block diagram illustrating one embodiment of a system 90. System 90 includes a host 92 and a memory device 100. Host 92 is communicatively coupled to memory device 100 through communication link 94. Host 92 includes a computer (e.g., desktop, laptop, handheld), portable electronic device (e.g., cellular phone, personal digital assistant (PDA), MP3 player, video player), or any other suitable device that uses memory. Memory device 100 provides memory for host 92. In one embodiment, memory device 100 includes a phase change memory device or other suitable resistive or resistivity changing material memory device.

Figure 2:
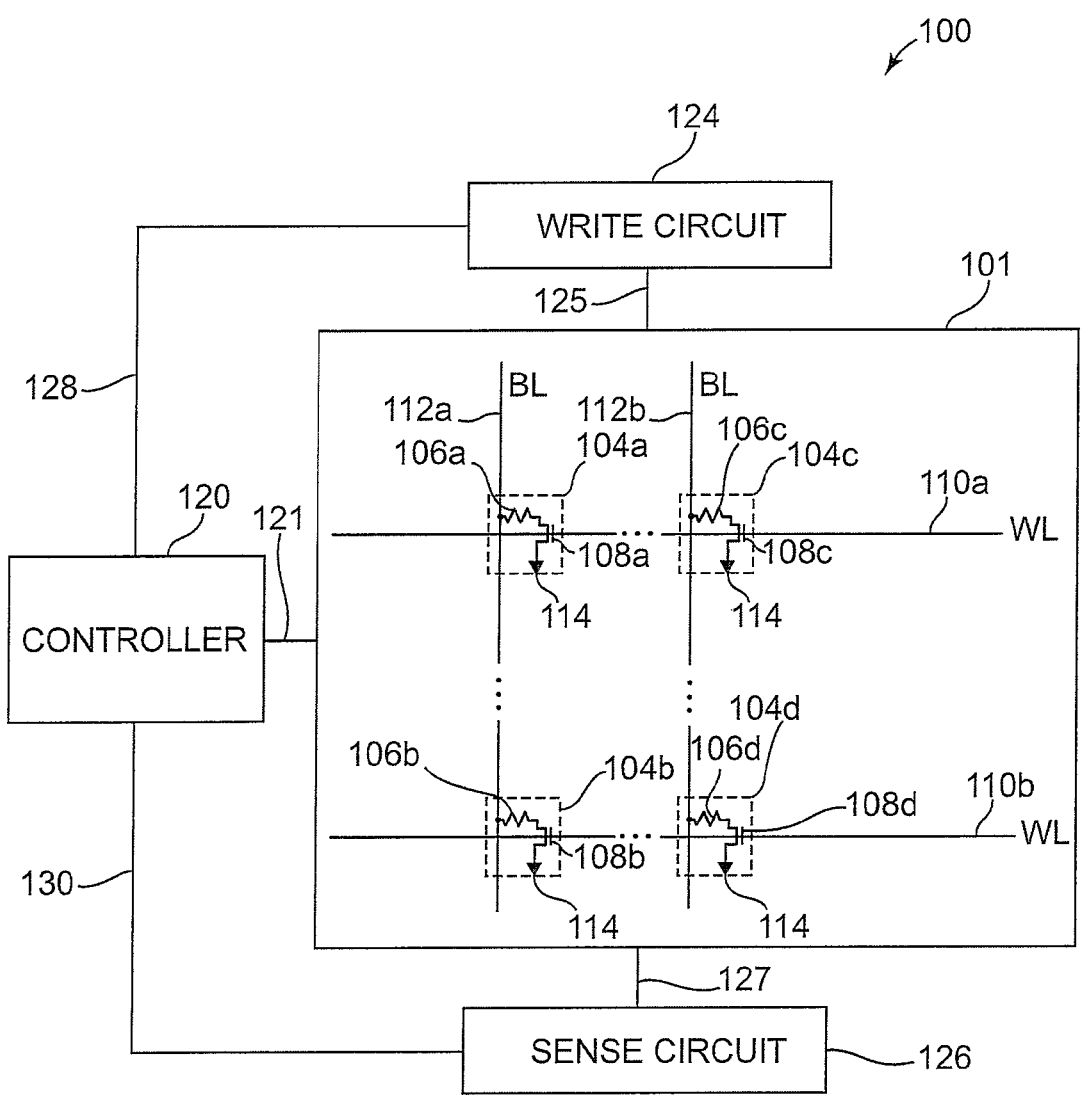
FIG. 2 is a diagram illustrating one embodiment of a memory device.

FIG. 2 is a diagram illustrating one embodiment of memory device 100. In one embodiment, memory device 100 is an integrated circuit or part of an integrated circuit. Memory device 100 includes write circuit 124, controller 120, memory array 101, and sense circuit 126. Memory array 101 includes a plurality of phase change memory cells 104a-104d (collectively referred to as phase change memory cells 104), a plurality of bit lines (BLs) 112a-112b (collectively referred to as bit lines 112), and a plurality of word lines (WLs) 110a-110b (collectively referred to as word lines 110).

Write circuit 124 provides pulses to phase change memory cells 104 to program the memory cells to a desired resistance state. To program a selected memory cell 104 to a desired resistance state, write circuit 124 applies a write pulse including a reset portion and a tail portion to the selected memory cell 104. The tail portion varies based on the desired resistance state of the selected memory cell 104. The tail portion varies such that the temperature of the phase change material is controlled over time such that the phase change material achieves the desired resistance state. To achieve the amorphous state, the tail portion is significantly shorter than the crystallization time of the phase change material. In one embodiment, to achieve the amorphous state, the tail portion is less than three nanoseconds. In one embodiment, the tail portion includes a negative gradient portion or a step function portion approximating the negative gradient portion. In another embodiment, the tail portion is replaced with a series of pulses that approximate the step function.

As used herein, the term "electrically coupled" is not meant to mean that the elements must be directly coupled together and intervening elements may be provided between the "electrically coupled" elements.

Memory array 101 is electrically coupled to write circuit 124 through signal path 125, to controller 120 through signal path 121, and to sense circuit 126 through signal path 127. Controller 120 is electrically coupled to write circuit 124 through signal path 128 and to sense circuit 126 through signal path 130. Each phase change memory cell 104 is electrically coupled to a word line 110, a bit line 112, and a common or ground 114. Phase change memory cell 104a is electrically coupled to bit line 112a, word line 110a, and common or ground 114, and phase change memory cell 104b is electrically coupled to bit line 112a, word line 110b, and common or ground 114. Phase change memory cell 104c is electrically coupled to bit line 112b, word line 110a, and common or ground 114, and phase change memory cell 104d is electrically coupled to bit line 112b, word line 10b, and common or ground 114.

Each phase change memory cell 104 includes a phase change element 106 and a transistor 108. While transistor 108 is a field-effect transistor (FET) in the illustrated embodiment, in other embodiments, transistor 108 can be another suitable device such as a bipolar transistor or a 3D transistor structure. In other embodiments, a diode-like structure may be used in place of transistor 108. Phase change memory cell 104a includes phase change element 106a and transistor 108a. One side of phase change element 106a is electrically coupled to bit line 112a, and the other side of phase change element 106a is electrically coupled to one side of the source-drain path of transistor 108a. The other side of the source-drain path of transistor 108a is electrically coupled to common or ground 114. The gate of transistor 108a is electrically coupled to word line 110a.

Phase change memory cell 104b includes phase change element 106b and transistor 108b. One side of phase change element 106b is electrically coupled to bit line 112a, and the other side of phase change element 106b is electrically coupled to one side of the source-drain path of transistor 108b. The other side of the source-drain path of transistor 108b is electrically coupled to common or ground 114. The gate of transistor 108b is electrically coupled to word line 110b.

Phase change memory cell 104c includes phase change element 106c and transistor 108c. One side of phase change element 106c is electrically coupled to bit line 112b and the other side of phase change element 106c is electrically coupled to one side of the source-drain path of transistor 108c. The other side of the source-drain path of transistor 108c is electrically coupled to common or ground 114. The gate of transistor 108c is electrically coupled to word line 110a.

Phase change memory cell 104d includes phase change element 106d and transistor 108d. One side of phase change element 106d is electrically coupled to bit line 112b and the other side of phase change element 106d is electrically coupled to one side of the source-drain path of transistor 108d. The other side of the source-drain path of transistor 108d is electrically coupled to common or ground 114. The gate of transistor 108d is electrically coupled to word line 110b.

In another embodiment, each phase change element 106 is electrically coupled to a common or ground 114 and each transistor 108 is electrically coupled to a bit line 112. For example, for phase change memory cell 104a, one side of phase change element 106a is electrically coupled to common or ground 114. The other side of phase change element 106a is electrically coupled to one side of the source-drain path of transistor 108a. The other side of the source-drain path of transistor 108a is electrically coupled to bit line 112a.

Each phase change element 106 comprises a phase change material that may be made up of a variety of materials in accordance with the present invention. Generally, chalcogenide alloys that contain one or more elements from group VI of the periodic table are useful as such materials. In one embodiment, the phase change material of phase change element 106 is made up of a chalcogenide compound material, such as GeSbTe, SbTe, GeTe or AgInSbTe. In another embodiment, the phase change material is chalcogen free, such as GeSb, GaSb, InSb, or GeGaInSb. In other embodiments the phase change material is made up of any suitable material including one or more of the elements Ge, Sb, Te, Ga, As, In, Se, and S.

Each phase change element 106 may be changed from an amorphous state to a crystalline state or from a crystalline state to an amorphous state under the influence of temperature change. The amount of crystalline material coexisting with amorphous material in the phase change material of one of the phase change elements 106a-106d thereby defines two or more states for storing data within memory device 100. In the amorphous state, a phase change material exhibits significantly higher resistivity than in the crystalline state. Therefore, the two or more states of phase change elements 106a-106d differ in their electrical resistivity. In one embodiment, the two or more states are two states and a binary system is used, wherein the two states are assigned bit values of "0" and "1". In another embodiment, the two or more states can be three states and a ternary system can be used, wherein the three states are assigned bit values of "0", "1", and "2". In another embodiment, the two or more states are four states that can be assigned multi-bit values, such as "00", "01", "10", and "11". In other embodiments, the two or more states can be any suitable number of states in the phase change material of a phase change element.

Controller 120 includes a microprocessor, microcontroller, or other suitable logic circuitry for controlling the operation of memory device 100. Controller 120 controls read and write operations of memory device 100 including the application of control and data signals to memory array 101 through write circuit 124 and sense circuit 126. In one embodiment, write circuit 124 provides voltage pulses through signal path 125 and bit lines 112 to memory cells 104 to program the memory cells. In other embodiments, write circuit 124 provides current pulses through signal path 125 and bit lines 112 to memory cells 104 to program the memory cells.

Sense circuit 126 reads each of the two or more states of memory cells 104 through bit lines 112 and signal path 127. In one embodiment, to read the resistance of one of the memory cells 104, sense circuit 126 provides current that flows through one of the memory cells 104. Sense circuit 126 then reads the voltage across that one of the memory cells 104. In one embodiment, sense circuit 126 provides voltage across one of the memory cells 104 and reads the current that flows through that one of the memory cells 104. In one embodiment, write circuit 124 provides voltage across one of the memory cells 104 and sense circuit 126 reads the current that flows through that one of the memory cells 104. In one embodiment, write circuit 124 provides current that flows through one of the memory cells 104 and sense circuit 126 reads the voltage across that one of the memory cells 104.

During a write operation of phase change memory cell 104a, one or more current or voltage pulses are selectively enabled by write circuit 124 and sent through bit line 112a to phase change element 106a thereby heating phase change element 106a above its melting temperature with word line 110a selected to activate transistor 108a. Depending upon the amount of time the memory element spends within the crystallization temperature range during the write pulse application, the phase change material experiences different amounts of crystallization. In this way, phase change element 106a reaches its amorphous state, crystalline state, or partially crystalline and partially amorphous state during this write operation. Phase change memory cells 104b-104d and other phase change memory cells 104 in memory array 101 are programmed similarly to phase change memory cell 104a using a similar current or voltage pulse or pulses.

Figure 3:
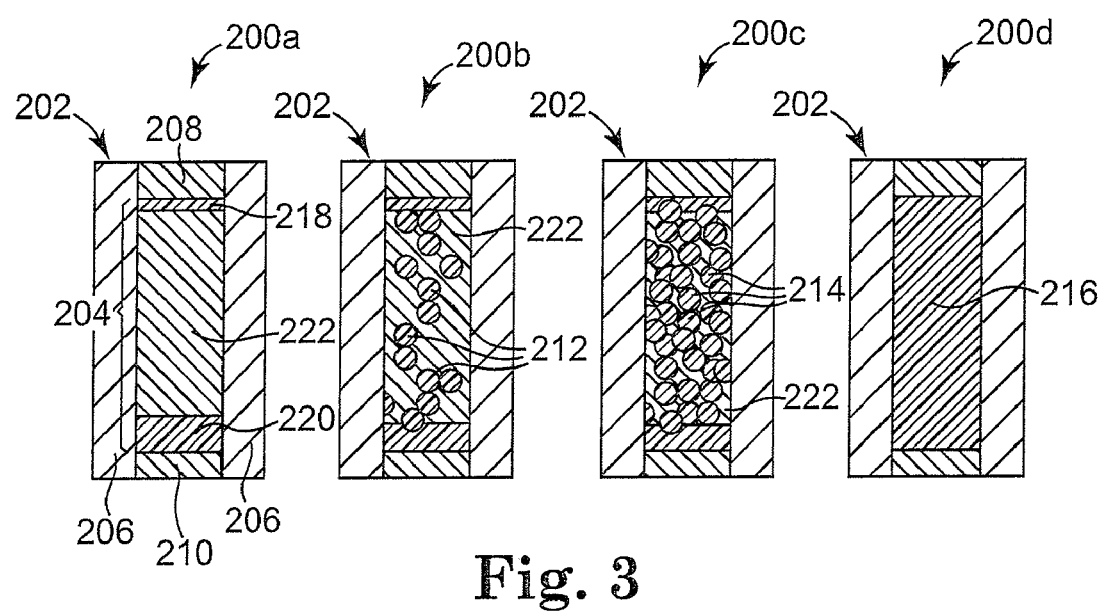
FIG. 3 is a diagram illustrating one embodiment of a phase change element in four different states.

FIG. 3 is a diagram illustrating one embodiment of a phase change element 202 in four different states at 200a, 200b, 200c, and 200d. Phase change element 202 includes a phase change material 204 that is laterally surrounded by insulation material 206. In other embodiments, phase change element 202 can have any suitable geometry including phase change material 204 in any suitable geometry and insulation material 206 in any suitable geometry.

Phase change material 204 is electrically coupled at one end to a first electrode 208 and at the other end to a second electrode 210. Pulses are provided to phase change element 202 via first electrode 208 and second electrode 210. The current path through phase change material 204 is from one of the first electrode 208 and second electrode 210 to the other one of the first electrode 208 and second electrode 210. In one embodiment, each of the phase change elements 106a-106d is similar to phase change element 202. Phase change element 202 provides a storage location for storing bits of data.

Insulation material 206 can be any suitable insulator, such as $SiO_2$, $SiO_x$, SiN, fluorinated silica glass (FSG), boro-phosphorous silicate glass (BPSG), or boro-silicate glass (BSG). First electrode 208 and second electrode 210 can be any suitable electrode material, such as TiN, TaN, W, WN, Al, C, Ti, Ta, TiSiN, TaSiN, TiAlN, TaAlN, or Cu.

Phase change material 204 is programmed into one of four states to store two bits of data. A selection device, such as an active device like a transistor 108 (FIG. 2) or diode, is coupled to first electrode 208 to control the application of pulses to phase change material 204. The pulses melt phase change material 204 and program one of the four states into phase change material 204. At 200a, a large fraction 222 of phase change material 204 has been programmed to change the resistance through phase change material 204 and phase change element 202. At 200b, a small fraction 212 of phase change material 204 has been programmed to change the resistance through phase change material 204 and phase change element 202. At 200c, a medium sized fraction 214 of phase change material 204 has been programmed to change the resistance through phase change material 204 and phase change element 202. At 200d, a large fraction 216, which is substantially all of phase change material 204, has been programmed to change the resistance through phase change material 204 and phase change element 202.

The size and state of the programmed fraction is related to the resistance through phase change material 204 and phase change element 202. The four different phase change fractions at 200a-200d provide four states in phase change material 204, and phase change element 202 provides a storage location for storing two bits of data. In one embodiment, the state of phase change element 202 at 200a is a "00", the state of phase change element 202 at 200b is a "01", the state of phase change element 202 at 200c is a "10", and the state of phase change element 202 at 200d is a "11".

At 200a, phase change material 204 is programmed to a substantially amorphous state. During a write operation of phase change element 202, a write pulse is selectively enabled by the selection device and sent through first electrode 208 and phase change material 204. The write pulse heats phase change material 204 above its melting temperature and phase change material 204 is quickly cooled to achieve the substantially amorphous state at 200a. After the write operation, phase change material 204 includes crystalline state phase change material at 218 and 220, and amorphous state phase change material at 222. The substantially amorphous state at 200a is the highest resistance state of phase change element 202.

To program phase change material 204 into one of the other three states 200b-200d, a write pulse that melts the phase change material and includes a tail portion corresponding to the desired state is provided via a write circuit, such as write circuit 124. At 200b, a write pulse having a tail portion including a first negative gradient or a first step function approximating the first negative gradient is provided to program the small volume fraction 212 into a crystalline state. The crystalline state is less resistive than the amorphous state and phase change element 202 at 200b has a lower resistance than phase change element 202 in the substantially amorphous state at 200a. The partially crystalline and partially amorphous state at 200b is the second highest resistance state of phase change element 202.

At 200c, a write pulse having a tail portion including a second negative gradient or a second step function approximating the second negative gradient is provided to program the medium volume fraction 214 into a crystalline state. Since the crystalline fraction 214 is larger than the crystalline fraction 212 and the crystalline state is less resistive than the amorphous state, phase change element 202 at 200c has a lower resistance than phase change element 202 at 200b and phase change element 202 in the substantially amorphous state at 200a. The partially crystalline and partially amorphous state at 200c is the second lowest resistance state of phase change element 202.

At 200d, a write pulse having a tail portion including a third negative gradient or a third step function approximating the third negative gradient is provided to program substantially all of the phase change material 216 into the crystalline state. Since the crystalline state is less resistive than the amorphous state, phase change element 202 at 200d has a lower resistance than phase change element 202 at 200c, phase change element 202 at 200b, and phase change element 202 in the substantially amorphous state at 200a. The substantially crystalline state at 200d is the lowest resistance state of phase change element 202. In other embodiments, phase change element 202 can be programmed into any suitable number of resistance values or states.

Figure 4:
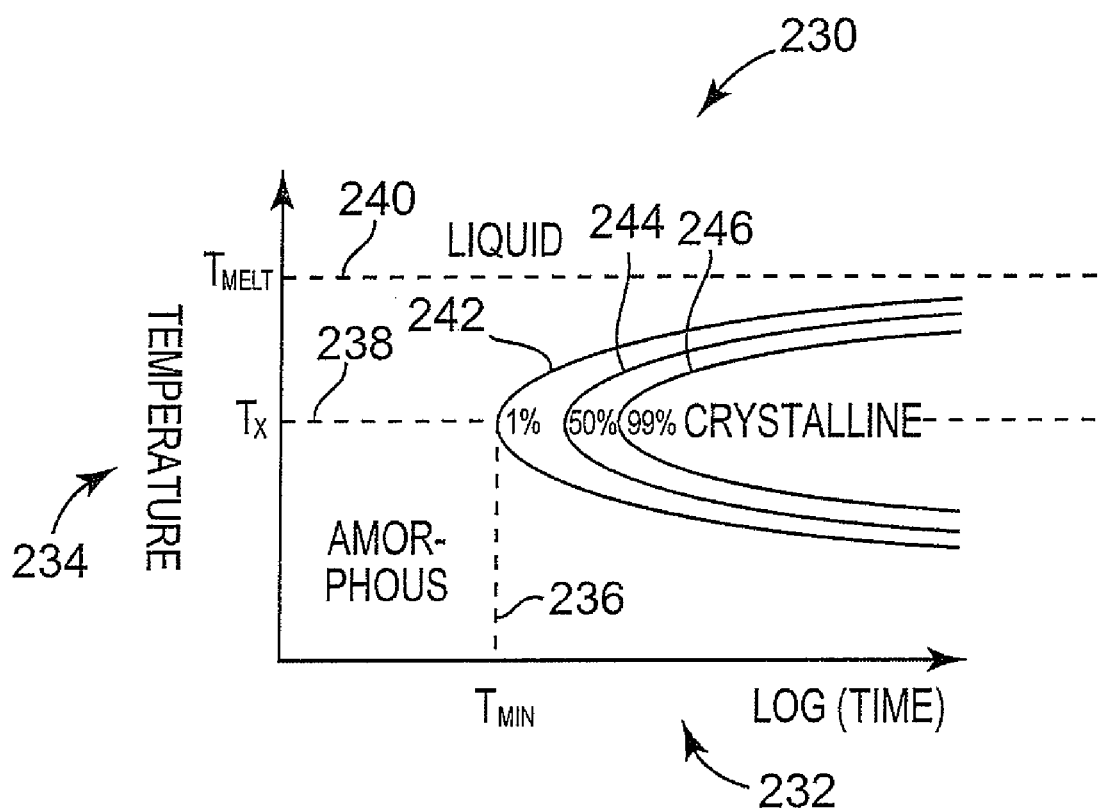
FIG. 4 is a graph illustrating one embodiment of the crystallization of phase change material based on temperature and time.

FIG. 4 is a graph 230 illustrating one embodiment of the crystallization of phase change material based on temperature and time. Graph 230 includes the log of time on x-axis 232 and temperature on y-axis 234. At a melting temperature ($T_{MELT}$) indicated at 240, the phase change material liquefies. At a crystallization temperature ($T_X$) indicated at 238 up until a minimum time ($T_{MIN}$) indicated at 236, the phase change material remains amorphous. After $T_{MIN}$ at 236, the phase change material begins to crystallize. After a first period as indicated at 242, approximately 1% of the phase change material is crystallized. After a second period as indicated at 244, approximately 50% of the phase change material is crystallized, and after a third period as indicated at 246, approximately 99% of the phase change material is crystallized. Therefore, by controlling the temperature of the phase change material over time, the amount of crystallized phase change material, and hence the resistance, can be controlled.

The log of time on x-axis 232 in FIG. 4 and in the following figures and the time on x-axis 262 in the following figures is provided in a simplified form. The actual times will vary based on the particular phase change material and memory cell configuration selected.

Figure 5A:
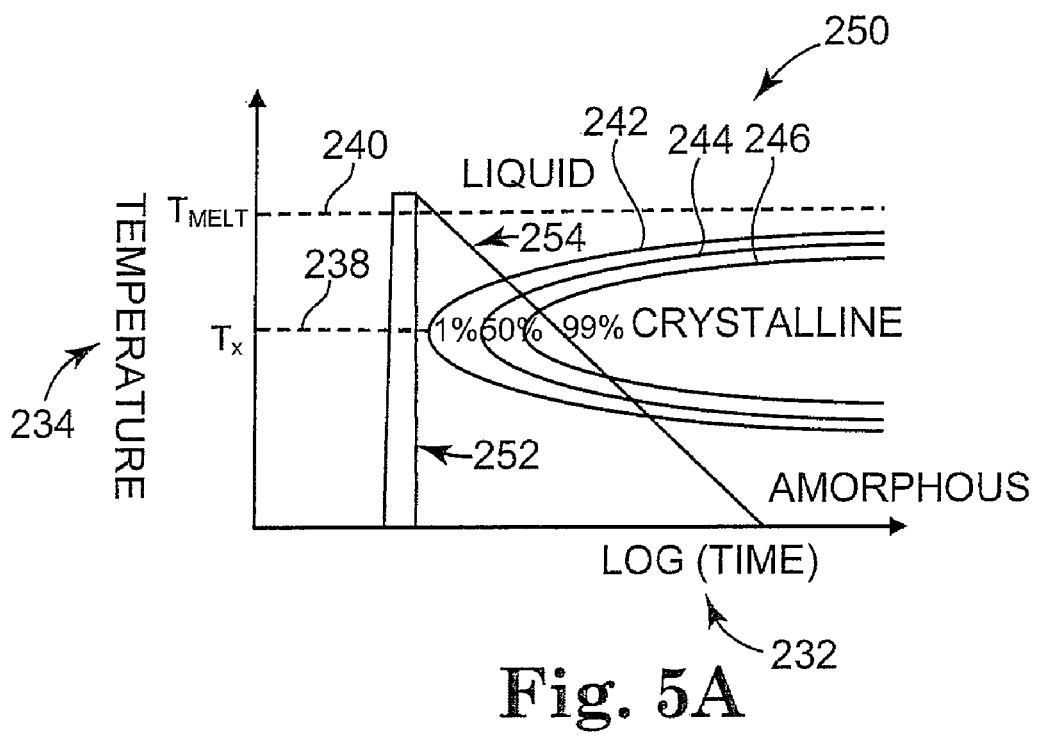
FIG. 5A is a graph illustrating one embodiment of temperature profiles for programming a phase change element to a selected one of two resistance states.

FIG. 5A is a graph 250 illustrating one embodiment of temperature profiles for programming a phase change element to a selected one of two resistance states. Graph 250 includes a first temperature profile 252 and a second temperature profile 254. First temperature profile 252 quickly rises above $T_{MELT}$ 240 and then quickly falls below $T_X$ 238 to program the phase change material to the substantially amorphous state as illustrated at 200a in FIG. 3. Second temperature profile 254 quickly rises above $T_{MELT}$ 240 and has a tail portion that gradually ramps down to below $T_X$ 238 to program the phase change material to the substantially crystalline state as illustrated at 200d in FIG. 3.

The temperature of a particular phase change element may vary in response to a write pulse in response to variations in the critical dimension (CD) during fabrication. Providing a longer tail portion having a range of amplitudes increases the likelihood that the write pulse will provide the optimum temperature for that particular phase change element. By providing the optimum temperature for the particular phase change element, a more uniform resistance distribution is achieved.

Figure 5B:
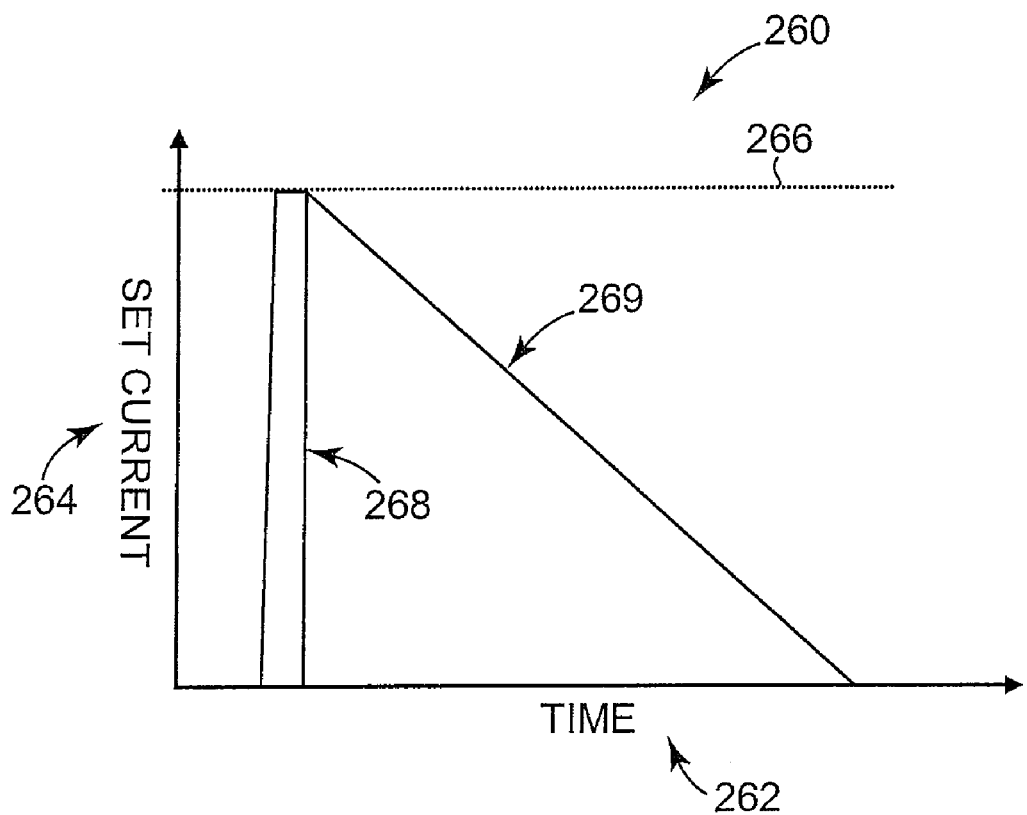
FIG. 5B is a graph illustrating one embodiment of write pulses for programming a phase change element to a selected one of two resistance states.

FIG. 5B is a graph 260 illustrating one embodiment of first and second pulses for programming a phase change element to a selected one of two resistance states. Graph 260 includes time on x-axis 262 and set current on y-axis 264. First pulse 268 provides first temperature profile 252 and second pulse 269 provides second temperature profile 254 as previously described and illustrated with reference to FIG. 5A. First pulse 268 provides a current that rises to a reset pulse height 266, which is a current that raises the temperature of the phase change material above $T_{MELT}$ 240, and then quickly returns to zero. Second pulse 269 provides a current that rises to reset pulse height 266 and then gradually ramps down to zero. In this way, the phase change material is programmed to either the substantially amorphous state or the substantially crystalline state.

Although the following FIGS. 6A-13B illustrate temperature profiles and write pulses for programming a phase change element to one of four resistance states, in other embodiments suitable temperature profiles and write pulses can be used to program a phase change element to one of any suitable number of resistance states, such as 3, 5, 6, 7, 8, or more.

Figure 6A:
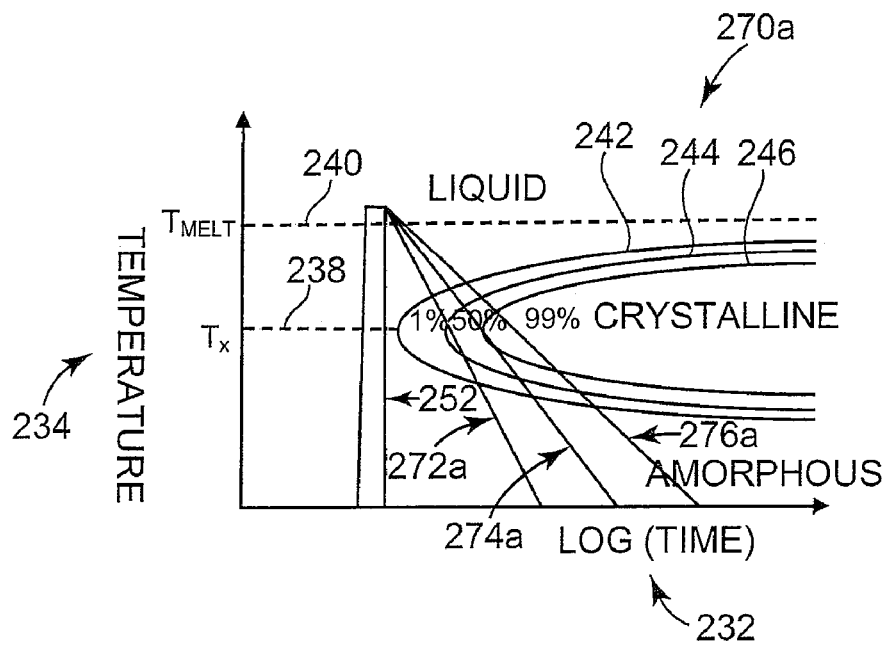
FIG. 6A is a graph illustrating one embodiment of temperature profiles for programming a phase change element to a selected one of four resistance states.

FIG. 6A is a graph 270a illustrating one embodiment of temperature profiles for programming a phase change element to a selected one of four resistance states. Graph 270a includes first temperature profile 252, a second temperature profile 272a, a third temperature profile 274a, and a fourth temperature profile 276a. First temperature profile 252 was previously described and illustrated with reference to FIG. 5A.

Second temperature profile 272a quickly rises above $T_{MELT}$ 240 and has a tail portion that gradually ramps down to below $T_X$ 238 to program the phase change material to the partially crystalline and partially amorphous state as illustrated at 200b in FIG. 3. Third temperature profile 274a quickly rises above $T_{MELT}$ 240 and has a tail portion that gradually ramps down to below $T_X$ 238 to program the phase change material to the partially crystalline and partially amorphous state as illustrated at 200c in FIG. 3. Fourth temperature profile 276a is similar to second temperature profile 254 previously described and illustrated with reference to FIG. 5A. Fourth temperature profile 276a quickly rises above $T_{MELT}$ 240 and has a tail portion that gradually ramps down to below $T_X$ 238 to program the phase change material to the substantially crystalline state as illustrated at 200d in FIG. 3.

The tail portion of third temperature profile 274a falls below $T_X$ 238 after the tail portion of second temperature profile 272a falls below $T_X$ 238. The tail portion of fourth temperature profile 276a falls below $T_X$ 238 after the tail portion of third temperature profile 274a falls below $T_X$ 238. Therefore, third temperature profile 274a crystallizes more phase change material than second temperature profile 272a, and fourth temperature profile 276a crystallizes more phase change material than third temperature profile 274a. In this way, third temperature profile 274a programs the phase change material to a lower resistance state than second temperature profile 272a, and fourth temperature profile 276a programs the phase change material to a lower resistance state than third temperature profile 274a.

Figure 6B:
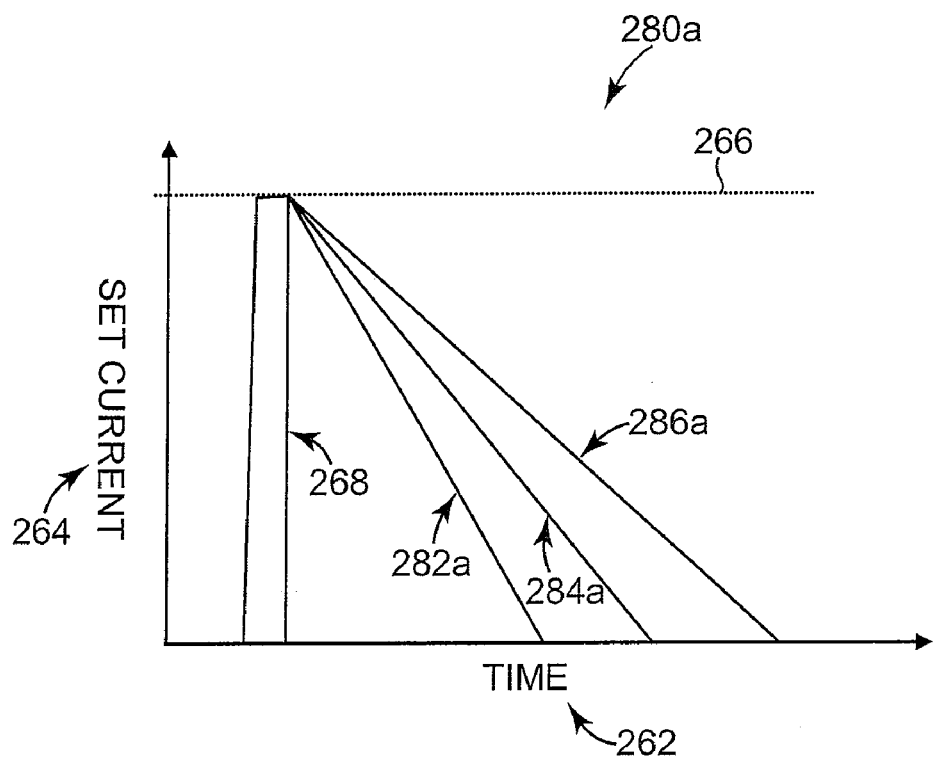
FIG. 6B is a graph illustrating one embodiment of write pulses for programming a phase change element to a selected one of four resistance states.

FIG. 6B is a graph 280a illustrating one embodiment of write pulses for programming a phase change element to a selected one of four resistance states. Graph 280a includes first write pulse 268, a second write pulse 282a, a third write pulse 284a, and a fourth write pulse 286a. First write pulse 268 was previously described and illustrated with reference to FIG. 5B. Second write pulse 282a provides second temperature profile 272a, third write pulse 284a provides third temperature profile 274a, and fourth write pulse 286a provides fourth temperature profile 276a as previously described and illustrated with reference to FIG. 6A.

Second write pulse 282a provides a current that rises to reset pulse height 266 and then gradually ramps down to zero. Third write pulse 284a provides a current that rises to reset pulse height 266 and then gradually ramps down to zero at a rate less than the rate of second write pulse 282a. Fourth write pulse 286a provides a current that rises to reset pulse height 266 and then gradually ramps down to zero at a rate less than the rate of third write pulse 284a. In this way, the phase change material is programmed to the selected one of four resistance states.

Figure 7A:
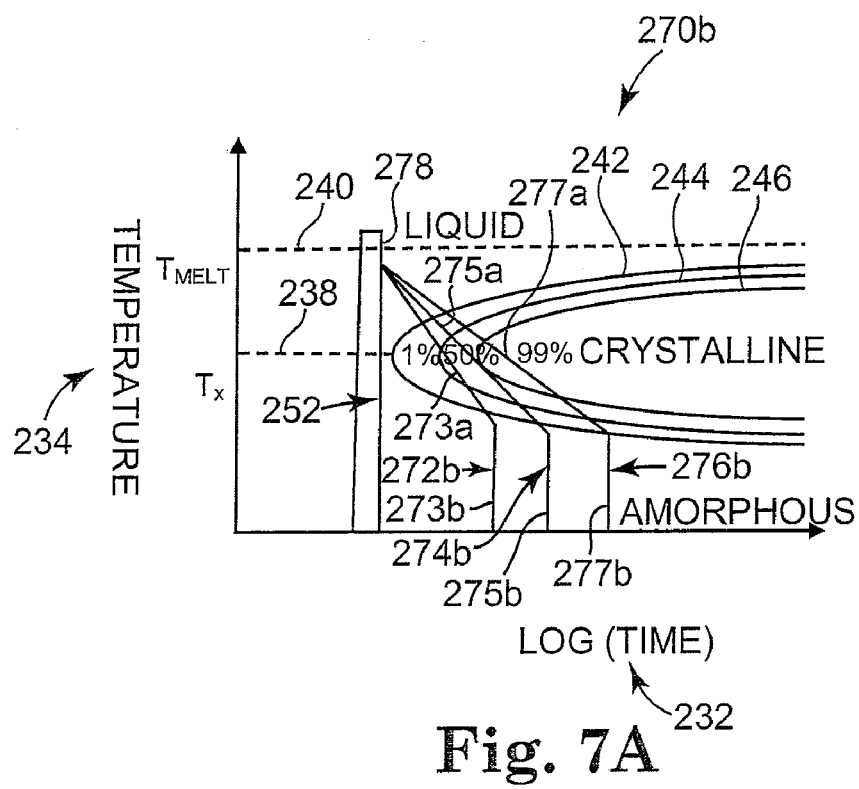
FIG. 7A is a graph illustrating another embodiment of temperature profiles for programming a phase change element to a selected one of four resistance states.

FIG. 7A is a graph 270b illustrating another embodiment of temperature profiles for programming a phase change element to a selected one of four resistance states. Graph 270b includes first temperature profile 252, a second temperature profile 272b, a third temperature profile 274b, and a fourth temperature profile 276b. First temperature profile 252 was previously described and illustrated with reference to FIG. 5A.

Second temperature profile 272b quickly rises above $T_{MELT}$ 240 and has a tail portion including a step portion 278, a gradient portion 273a that gradually ramps down to below $T_X$ 238, and a step portion 273b. Step portion 278 quickly falls from above $T_{MELT}$ 240 to below $T_{MELT}$ 240 since the phase change material does not crystallize at these temperatures. Gradient portion 273a programs the phase change material to the partially crystalline and partially amorphous state as illustrated at 200b in FIG. 3. Step portion 273b quickly reduces the temperature of the phase change material once the temperature of the phase change material falls to a temperature where no further crystallization occurs. Step portions 278 and 273b reduce the overall time of second temperature profile 272b compared to second temperature profile 272a previously described and illustrated with reference to FIG. 6A.

Third temperature profile 274b quickly rises above $T_{MELT}$ 240 and has a tail portion including step portion 278, a gradient portion 275a that gradually ramps down to below $T_X$ 238, and a step portion 275b. Gradient portion 275a programs the phase change material to the partially crystalline and partially amorphous state as illustrated at 200c in FIG. 3. Step portion 275b quickly reduces the temperature of the phase change material once the temperature of the phase change material falls to a temperature where no further crystallization occurs. Step portions 278 and 275b reduce the overall time of third temperature profile 274b compared to third temperature profile 274a previously described and illustrated with reference to FIG. 6A.

Fourth temperature profile 276b quickly rises above $T_{MELT}$ 240 and has a tail portion including step portion 278, a gradient portion 277a that gradually ramps down to below $T_X$ 238, and a step portion 277b. Gradient portion 277a programs the phase change material to the substantially crystalline state as illustrated at 200d in FIG. 3. Step portion 277b quickly reduces the temperature of the phase change material once the temperature of the phase change material falls to a temperature where no further crystallization occurs. Step portions 278 and 277b reduce the overall time of fourth temperature profile 276b compared to fourth temperature profile 276a previously described and illustrated with reference to FIG. 6A.

Gradient portion 275a of third temperature profile 274b falls below $T_X$ 238 after gradient portion 273a of second temperature profile 272b falls below $T_X$ 238. Gradient portion 277a of fourth temperature profile 276b falls below $T_X$ 238 after gradient portion 275a of third temperature profile 274b falls below $T_X$ 238. Therefore, third temperature profile 274b crystallizes more phase change material than second temperature profile 272b, and fourth temperature profile 276b crystallizes more phase change material than third temperature profile 274b. In this way, third temperature profile 274b programs the phase change material to a lower resistance state than second temperature profile 272b, and fourth temperature profile 276b programs the phase change material to a lower resistance state than third temperature profile 274b.

Figure 7B:
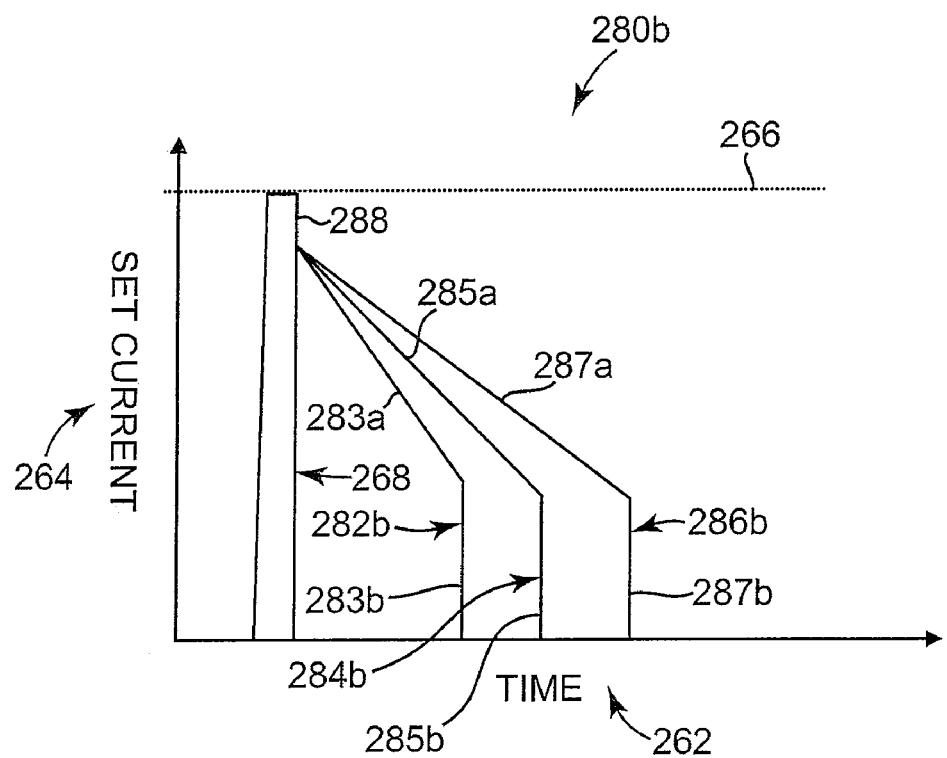
FIG. 7B is a graph illustrating another embodiment of write pulses for programming a phase change element to a selected one of four resistance states.

FIG. 7B is a graph 280b illustrating another embodiment of write pulses for programming a phase change element to a selected one of four resistance states. Graph 280b includes first write pulse 268, a second write pulse 282b, a third write pulse 284b, and a fourth write pulse 286b. First write pulse 268 was previously described and illustrated with reference to FIG. 5B. Second write pulse 282b provides second temperature profile 272b, third write pulse 284b provides third temperature profile 274b, and fourth write pulse 286b provides fourth temperature profile 276b as previously described and illustrated with reference to FIG. 7A.

Second write pulse 282b provides a current that rises to reset pulse height 266 and a tail portion including a step portion 288, a gradient portion 283a, and a step portion 283b. Step portion 288 quickly reduces the current below reset pulse height 266 to provide step portion 278 of temperature profiles 272b, 274b, and 276b illustrated in FIG. 7A. Gradient portion 283a gradually ramps down the current to provide gradient portion 273a of second temperature profile 272b illustrated in FIG. 7A. Step portion 283b quickly reduces the current to zero to provide step portion 273b of second temperature profile 272b illustrated in FIG. 7A.

Third write pulse 284b provides a current that rises to reset pulse height 266 and a tail portion including step portion 288, a gradient portion 285a, and a step portion 285b. Gradient portion 285a gradually ramps down the current at a rate less than gradient portion 283a of second write pulse 282b to provide gradient portion 275a of third temperature profile 274b illustrated in FIG. 7A. Step portion 285b quickly reduces the current to zero to provide step portion 275b of third temperature profile 274b illustrated in FIG. 7A.

Fourth write pulse 286b provides a current that rises to reset pulse height 266 and a tail portion including step portion 288, a gradient portion 287a, and a step portion 287b. Gradient portion 287a gradually ramps down the current at a rate less than gradient portion 285a of third write pulse 284b to provide gradient portion 277a of fourth temperature profile 276b illustrated in FIG. 7A. Step portion 287b quickly reduces the current to zero to provide step portion 277b of fourth temperature profile 276b illustrated in FIG. 7A. In this way, the phase change material is programmed to the selected one of four resistance states.

Figure 8A:
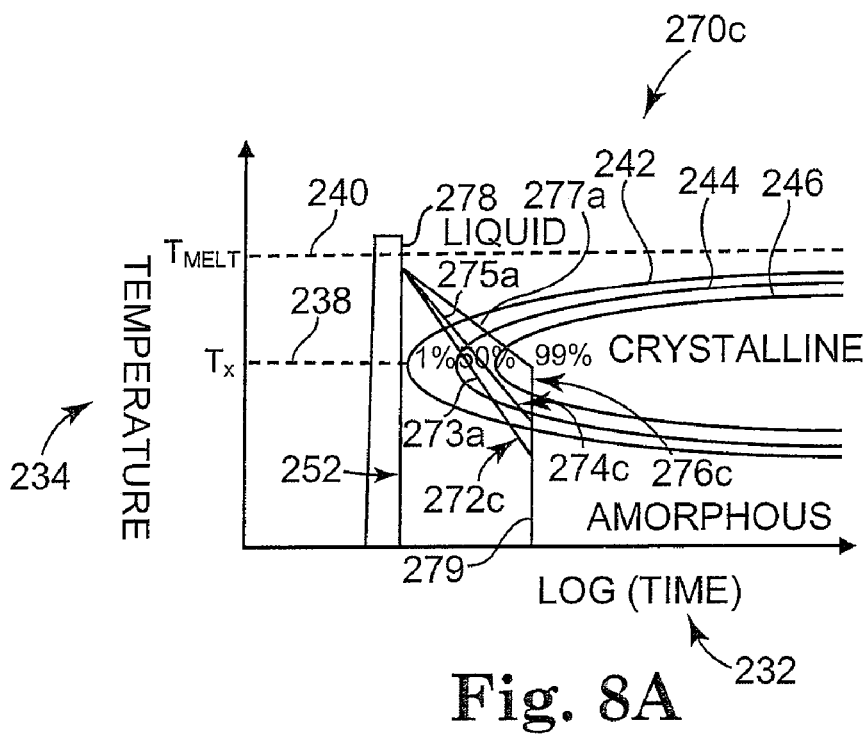
FIG. 8A is a graph illustrating another embodiment of temperature profiles for programming a phase change element to a selected one of four resistance states.

FIG. 8A is a graph 270c illustrating another embodiment of temperature profiles for programming a phase change element to a selected one of four resistance states. Graph 270c includes first temperature profile 252, a second temperature profile 272c, a third temperature profile 274c, and a fourth temperature profile 276c. First temperature profile 252 was previously described and illustrated with reference to FIG. 5A. In this embodiment, each temperature profile 272c, 274c, and 276c has the same length.

Second temperature profile 272c quickly rises above $T_{MELT}$ 240 and has a tail portion including a step portion 278, a gradient portion 273a that gradually ramps down to below $T_X$ 238, and a step portion 279. Step portion 278 quickly falls from above $T_{MELT}$ 240 to below $T_{MELT}$ 240. Gradient portion 273a programs the phase change material to the partially crystalline and partially amorphous state as illustrated at 200b in FIG. 3. Step portion 279 quickly reduces the temperature of the phase change material once the temperature of the phase change material falls to a temperature where no further crystallization occurs.

Third temperature profile 274c quickly rises above $T_{MELT}$ 240 and has a tail portion including step portion 278, a gradient portion 275a that gradually ramps down to below $T_X$ 238, and step portion 279. Gradient portion 275a programs the phase change material to the partially crystalline and partially amorphous state as illustrated at 200c in FIG. 3.

Fourth temperature profile 276c quickly rises above $T_{MELT}$ 240 and has a tail portion including step portion 278, a gradient portion 277a that gradually ramps down to below $T_X$ 238, and step portion 279. Gradient portion 277a programs the phase change material to the substantially crystalline state as illustrated at 200d in FIG. 3.

Gradient portion 275a of third temperature profile 274c falls below $T_X$ 238 after gradient portion 273a of second temperature profile 272c falls below $T_X$ 238. Gradient portion 277a of fourth temperature profile 276c falls below $T_X$ 238 after gradient portion 275a of third temperature profile 274c falls below $T_X$ 238. Therefore, third temperature profile 274c crystallizes more phase change material than second temperature profile 272c, and fourth temperature profile 276c crystallizes more phase change material than third temperature profile 274c. In this way, third temperature profile 274c programs the phase change material to a lower resistance state than second temperature profile 272c, and fourth temperature profile 276c programs the phase change material to a lower resistance state than third temperature profile 274c.

Figure 8B:
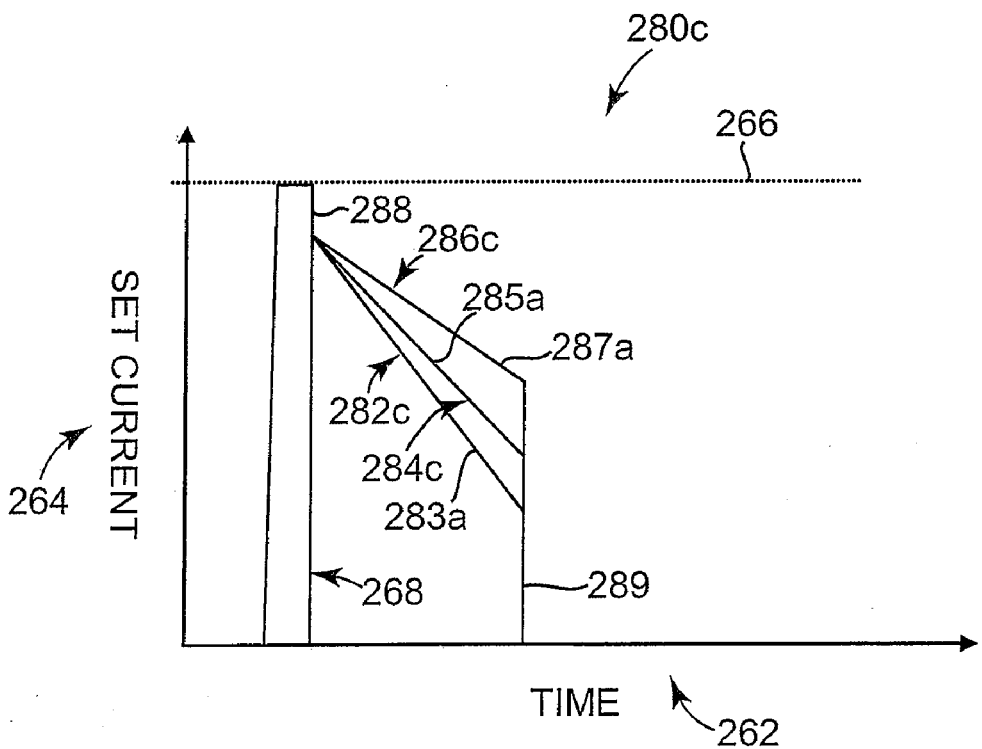
FIG. 8B is a graph illustrating another embodiment of write pulses for programming a phase change element to a selected one of four resistance states.

FIG. 8B is a graph 280c illustrating another embodiment of write pulses for programming a phase change element to a selected one of four resistance states. Graph 280c includes first write pulse 268, a second write pulse 282c, a third write pulse 284c, and a fourth write pulse 286c. First write pulse 268 was previously described and illustrated with reference to FIG. 5B. Second write pulse 282c provides second temperature profile 272c, third write pulse 284c provides third temperature profile 274c, and fourth write pulse 286c provides fourth temperature profile 276c as previously described and illustrated with reference to FIG. 8A.

Second write pulse 282c provides a current that rises to reset pulse height 266 and a tail portion including a step portion 288, a gradient portion 283a, and a step portion 289. Step portion 288 quickly reduces the current below reset pulse height 266 to provide step portion 278 of temperature profiles 272c, 274c, and 276c illustrated in FIG. 8A. Gradient portion 283a gradually ramps down the current to provide gradient portion 273a of second temperature profile 272c illustrated in FIG. 8A. Step portion 289 quickly reduces the current to zero to provide step portion 279 of temperature profiles 272c, 274c, and 276c illustrated in FIG. 8A.

Third write pulse 284c provides a current that rises to reset pulse height 266 and a tail portion including step portion 288, a gradient portion 285a, and step portion 289. Gradient portion 285a gradually ramps down the current at a rate less than gradient portion 283a of second write pulse 282c to provide gradient portion 275a of third temperature profile 274c illustrated in FIG. 8A.

Fourth write pulse 286c provides a current that rises to reset pulse height 266 and a tail portion including step portion 288, a gradient portion 287a, and step portion 289. Gradient portion 287a gradually ramps down the current at a rate less than gradient portion 285a of third write pulse 284c to provide gradient portion 277a of fourth temperature profile 276c illustrated in FIG. 8A. In this way, the phase change material is programmed to the selected one of four resistance states.

Figure 9A:
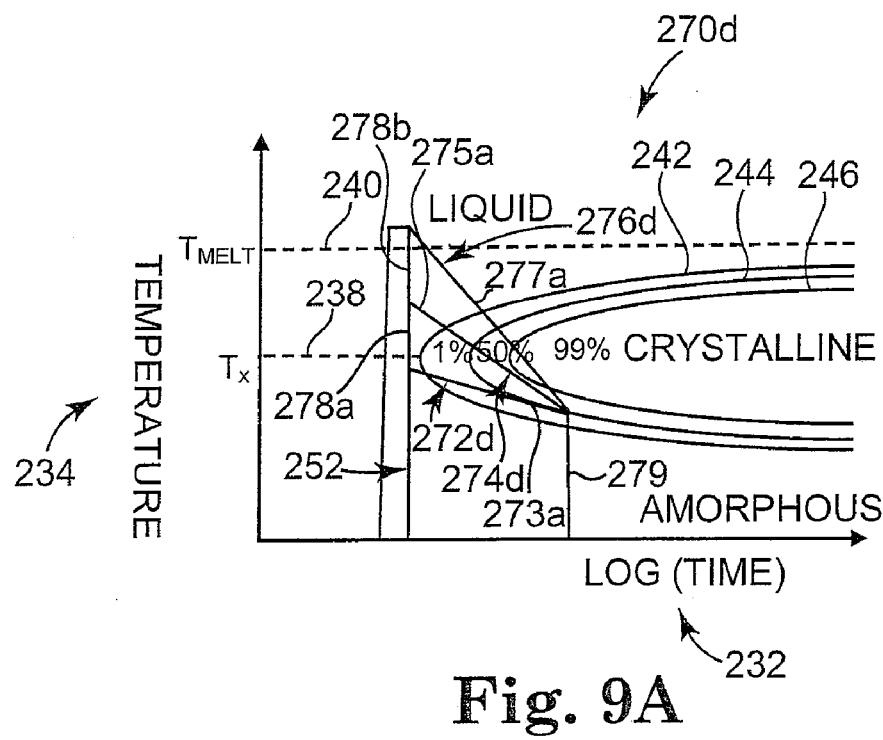
FIG. 9A is a graph illustrating another embodiment of temperature profiles for programming a phase change element to a selected one of four resistance states.

FIG. 9A is a graph 270d illustrating another embodiment of temperature profiles for programming a phase change element to a selected one of four resistance states. Graph 270d includes first temperature profile 252, a second temperature profile 272d, a third temperature profile 274d, and a fourth temperature profile 276d. First temperature profile 252 was previously described and illustrated with reference to FIG. 5A.

Second temperature profile 272d quickly rises above T$_{MELT}$ 240 and has a tail portion including a step portion 278a, a gradient portion 273a that gradually ramps down below T$_X$ 238, and a step portion 279. Step portion 278a quickly falls from above T$_{MELT}$ 240 to around T$_X$ 238. Gradient portion 273a programs the phase change material to the partially crystalline and partially amorphous state as illustrated at 200b in FIG. 3. Step portion 279 quickly reduces the temperature of the phase change material once the temperature of the phase change material falls to a temperature where no further crystallization occurs.

Third temperature profile 274d quickly rises above T$_{MELT}$ 240 and has a tail portion including a step portion 278b, a gradient portion 275a that gradually ramps down to below T$_X$ 238, and step portion 279. Step portion 278b quickly falls from above T$_{MELT}$ 240 to below T$_{MELT}$ 240. Gradient portion 275a programs the phase change material to the partially crystalline and partially amorphous state as illustrated at 200c in FIG. 3.

Fourth temperature profile 276d quickly rises above T$_{MELT}$ 240 and has a tail portion including a gradient portion 277a that gradually ramps down to below T$_X$ 238 and step portion 279. Gradient portion 277a programs the phase change material to the substantially crystalline state as illustrated at 200d in FIG. 3.

Gradient portion 275a of third temperature profile 274d falls below T$_X$ 238 after gradient portion 273a of second temperature profile 272d falls below T$_X$ 238. Gradient portion 277a of fourth temperature profile 276d falls below T$_X$ 238 after gradient portion 275a of third temperature profile 274d falls below T$_X$ 238. Therefore, third temperature profile 274d crystallizes more phase change material than second temperature profile 272d, and fourth temperature profile 276d crystallizes more phase change material than third temperature profile 274d. In this way, third temperature profile 274d programs the phase change material to a lower resistance state than second temperature profile 272d, and fourth temperature profile 276d programs the phase change material to a lower resistance state than third temperature profile 274d.

Figure 9B:
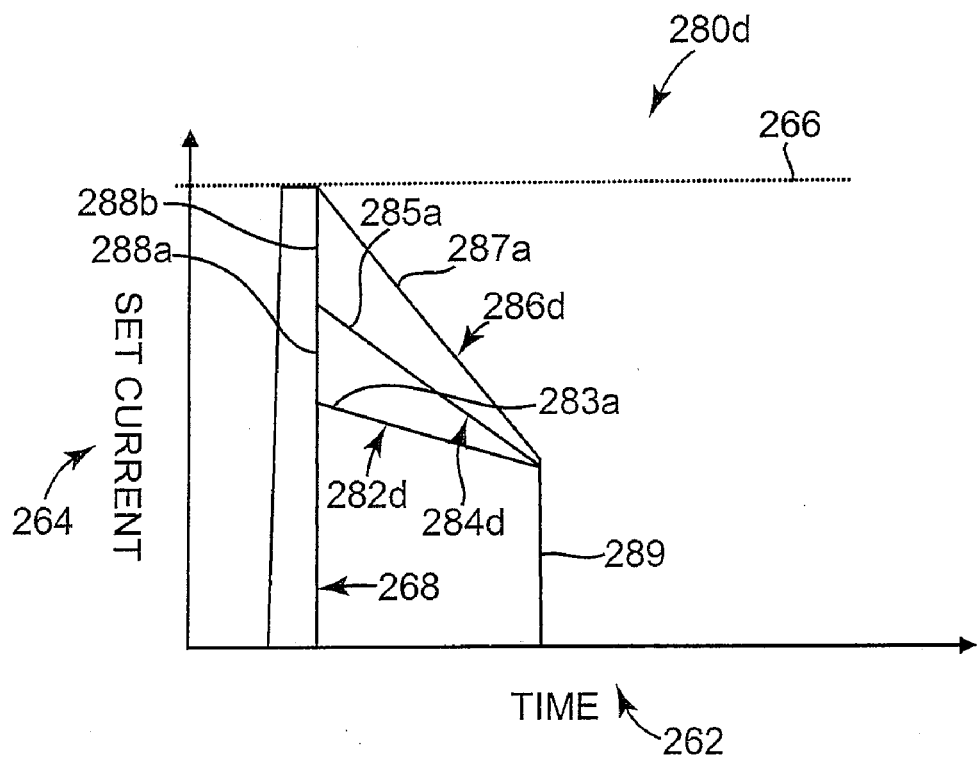
FIG. 9B is a graph illustrating another embodiment of write pulses for programming a phase change element to a selected one of four resistance states.

FIG. 9B is a graph 280d illustrating another embodiment of write pulses for programming a phase change element to a selected one of four resistance states. Graph 280d includes first write pulse 268, a second write pulse 282d, a third write pulse 284d, and a fourth write pulse 286d. First write pulse 268 was previously described and illustrated with reference to FIG. 5B. Second write pulse 282d provides second temperature profile 272d, third write pulse 284d provides third temperature profile 274d, and fourth write pulse 286d provides fourth temperature profile 276d as previously described and illustrated with reference to FIG. 9A.

Second write pulse 282d provides a current that rises to reset pulse height 266 and a tail portion including a step portion 288a, a gradient portion 283a, and a step portion 289. Step portion 288a quickly reduces the current below reset pulse height 266 to provide step portion 278a of second temperature profile 272d illustrated in FIG. 9A. Gradient portion 283a gradually ramps down the current to provide gradient portion 273a of second temperature profile 272d illustrated in FIG. 9A. Step portion 289 quickly reduces the current to zero to provide step portion 279 of temperature profiles 272d, 274d, and 276d illustrated in FIG. 9A.

Third write pulse 284d provides a current that rises to reset pulse height 266 and a tail portion including a step portion 288b, a gradient portion 285a, and step portion 289. Step portion 288b quickly reduces the current below reset pulse height 266 to provide step portion 278b of third temperature profile 274d illustrated in FIG. 9A. Gradient portion 285a gradually ramps down the current at a rate greater than gradient portion 283a of second write pulse 282d to provide gradient portion 275a of third temperature profile 274d illustrated in FIG. 9A.

Fourth write pulse 286d provides a current that rises to reset pulse height 266 and a tail portion including a gradient portion 287a and step portion 289. Gradient portion 287a gradually ramps down the current at a rate greater than gradient portion 285a of third write pulse 284d to provide gradient portion 277a of fourth temperature profile 276d illustrated in FIG. 9A. In this way, the phase change material is programmed to the selected one of four resistance states.

Figure 10A:
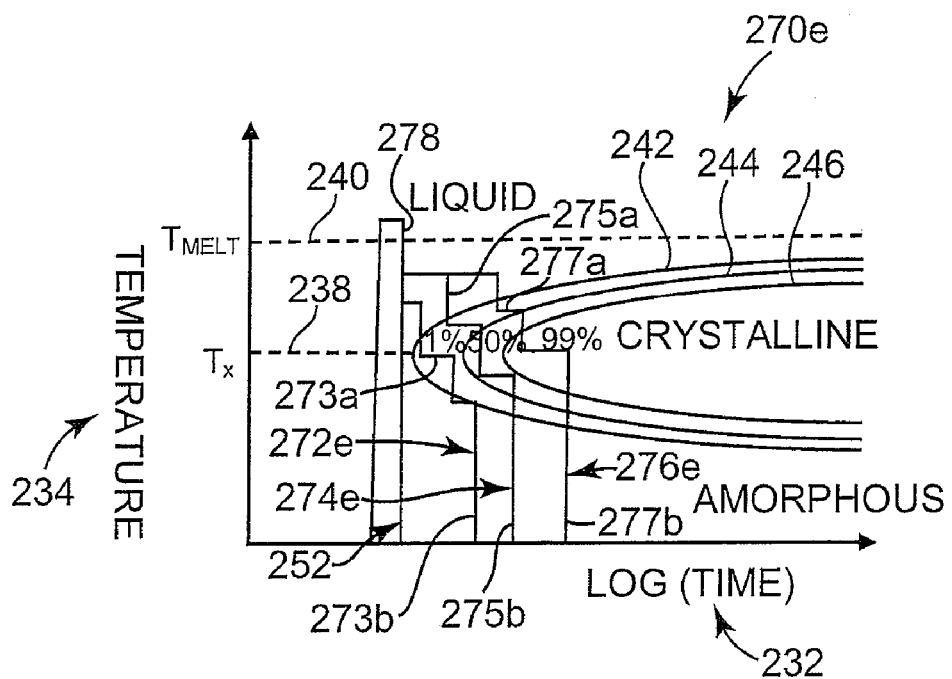
FIG. 10A is a graph illustrating another embodiment of temperature profiles for programming a phase change element to a selected one of four resistance states.

FIG. 10A is a graph 270e illustrating another embodiment of temperature profiles for programming a phase change element to a selected one of four resistance states. Graph 270e includes first temperature profile 252, a second temperature profile 272e, a third temperature profile 274e, and a fourth temperature profile 276e. First temperature profile 252 was previously described and illustrated with reference to FIG. 5A.

Second temperature profile 274e is similar to second temperature profile 272b previously described and illustrated with reference to FIG. 7A, except that gradient portion 273a of second temperature profile 272e is approximated by a step function. The step function can include any suitable number of steps, such as any number of steps between two and fifty. Step function portion 273a programs the phase change material to the partially crystalline and partially amorphous state as illustrated at 200b in FIG. 3.

Likewise, third temperature profile 274e is similar to third temperature profile 274b previously described and illustrated with reference to FIG. 7A, except that gradient portion 275a of third temperature profile 274e is approximated by a step function. Step function portion 275a programs the phase change material to the partially crystalline and partially amorphous state as illustrated at 200c in FIG. 3.

Likewise, fourth temperature profile 276e is similar to fourth temperature profile 276b previously described and illustrated with reference to FIG. 7A, except that gradient portion 277a of fourth temperature profile 276e is approximated by a step function. Step function portion 277a programs the phase change material to the substantially crystalline state as illustrated at 200d in FIG. 3.

Step function portion 275a of third temperature profile 274e falls below T$_X$ 238 after step function portion 273a of second temperature profile 272e falls below T$_X$ 238. Step function portion 277a of fourth temperature profile 276e falls below T$_X$ 238 after step function portion 275a of third temperature profile 274e falls below T$_X$ 238. Therefore, third temperature profile 274e crystallizes more phase change material than second temperature profile 272e, and fourth temperature profile 276e crystallizes more phase change material than third temperature profile 274e. In this way, third temperature profile 274e programs the phase change material to a lower resistance state than second temperature profile 272e, and fourth temperature profile 276e programs the phase change material to a lower resistance state than third temperature profile 274e.

Figure 10B:
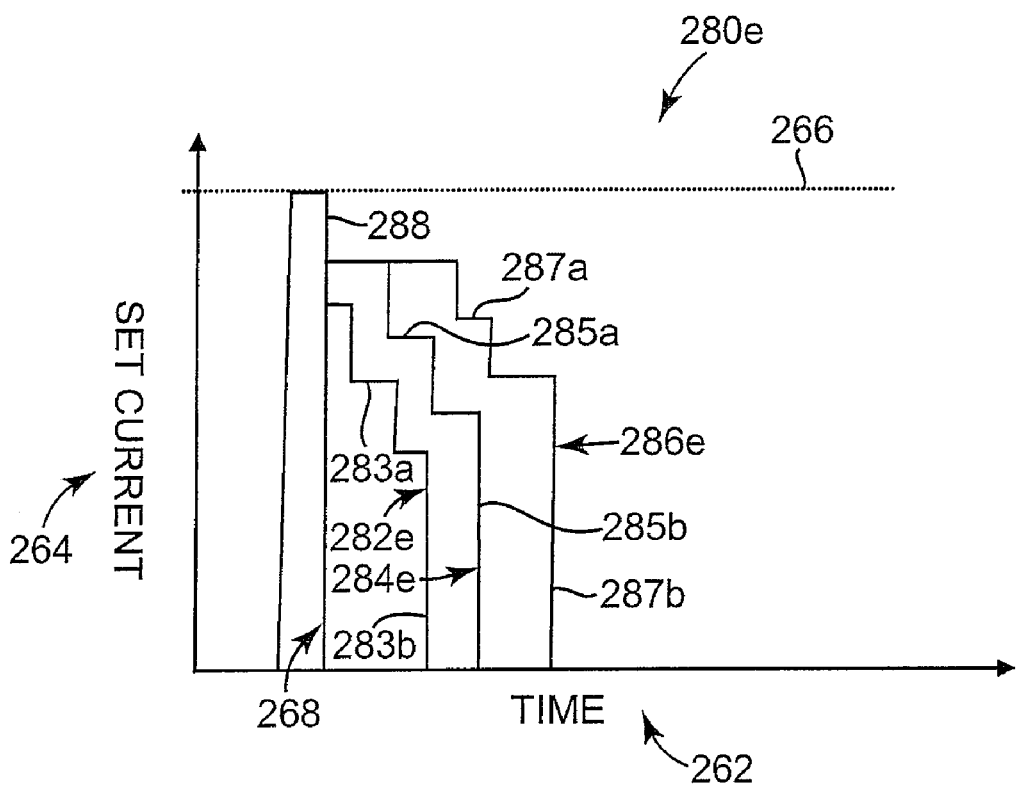
FIG. 10B is a graph illustrating another embodiment of write pulses for programming a phase change element to a selected one of four resistance states.

FIG. 10B is a graph 280e illustrating another embodiment of write pulses for programming a phase change element to a selected one of four resistance states. Graph 280e includes first write pulse 268, a second write pulse 282e, a third write pulse 284e, and a fourth write pulse 286e. First write pulse 268 was previously described and illustrated with reference to FIG. 5B. Second write pulse 282e provides second temperature profile 272e, third write pulse 284e provides third temperature profile 274e, and fourth write pulse 286e provides fourth temperature profile 276e as previously described and illustrated with reference to FIG. 10A.

Second write pulse 282e is similar to second write pulse 282b previously described and illustrated with reference to FIG. 7B, except that gradient portion 283a of second write pulse 282e is approximated by a step function. The step function can include any suitable number of steps, such as any number of steps between two and fifty. Step function portion 283a gradually steps down the current to provide step function portion 273a of second temperature profile 272e illustrated in FIG. 10A.

Likewise, third write pulse 284e is similar to third write pulse 284b previously described and illustrated with reference to FIG. 7B, except that gradient portion 285a of third write pulse 284e is approximated by a step function. Step function portion 285a gradually steps down the current at a rate less than step function portion 283a of second write pulse 282e to provide step function portion 275a of third temperature profile 274e illustrated in FIG. 10A.

Likewise, fourth write pulse 286e is similar to fourth write pulse 286b previously described and illustrated with reference to FIG. 7B, except that gradient portion 287a of fourth write pulse 286e is approximated by a step function. Step function portion 287a gradually steps down the current at a rate less than step function portion 285a of third write pulse 284e to provide step function portion 277a of fourth temperature profile 276e illustrated in FIG. 10A. In this way, the phase change material is programmed to the selected one of four resistance states.

Figure 11A:
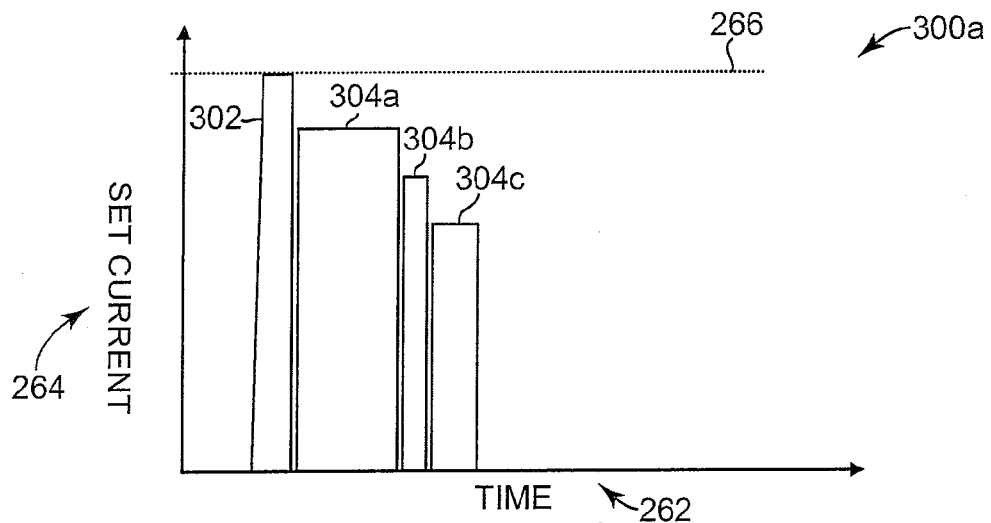
FIG. 11A is a graph illustrating another embodiment of write pulses for programming a phase change element to a selected resistance state.

FIG. 11A is a graph 300a illustrating another embodiment of write pulses for programming a phase change element to a selected resistance state. Graph 300a illustrates multiple write pulses to use in place of write pulse 286e previously described and illustrated with reference to FIG. 10B. The multiple write pulses program a phase change element to a substantially crystalline state as illustrated at 200d in FIG. 3. First, a write pulse 302 is applied to the phase change material. Next, step function 287a illustrated in FIG. 10B is replaced with a series of pulses 304a, 304b, and 304c, which provide a similar temperature profile to fourth temperature profile 276e illustrated in FIG. 10A. Any suitable number of pulses can be applied, such as any number between two and fifty. In one embodiment, the time between pulses 302, 304a, 304b, and 304c is less than 10 ns. In another embodiment, the time between pulses 302, 304a, 304b, and 304c is less than 1 ns.

Figure 11B:
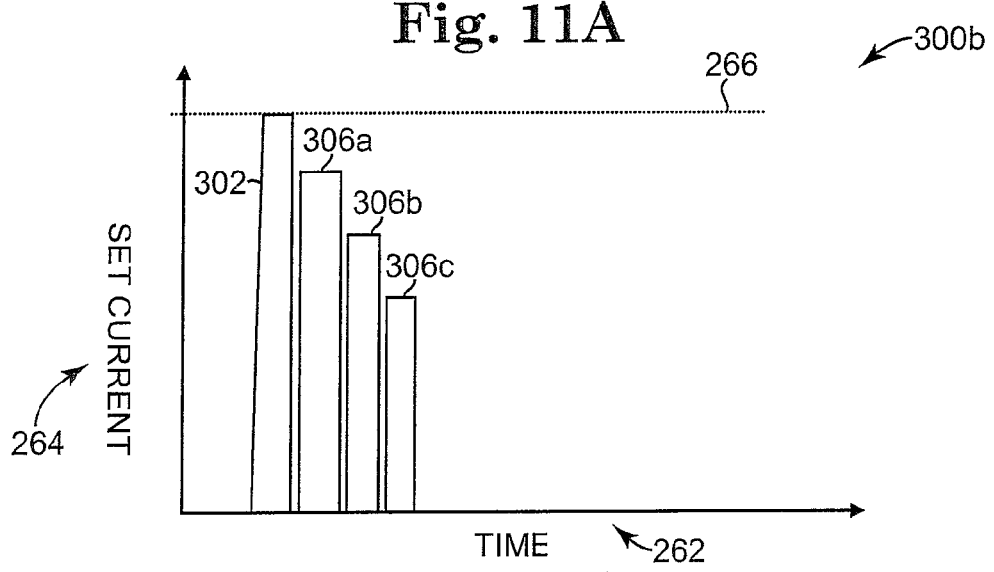
FIG. 11B is a graph illustrating another embodiment of write pulses for programming a phase change element to a selected resistance state.

FIG. 11B is a graph 300b illustrating another embodiment of write pulses for programming a phase change element to a selected resistance state. Graph 300b illustrates multiple write pulses to use in place of write pulse 284e previously described and illustrated with reference to FIG. 10B. The multiple write pulses program a phase change element to a partially crystalline and partially amorphous state as illustrated at 200c in FIG. 3. First, a write pulse 302 is applied to the phase change material. Next, step function 285a illustrated in FIG. 10B is replaced with a series of pulses 306a, 306b, and 306c, which provide a similar temperature profile to third temperature profile 274e illustrated in FIG. 10A.

Figure 11C:
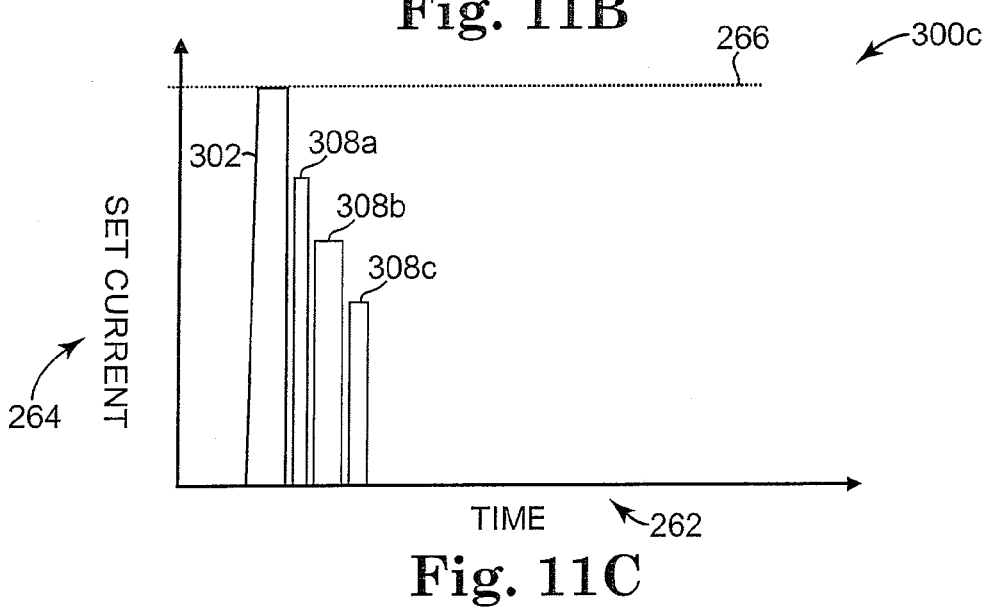
FIG. 11C is a graph illustrating another embodiment of write pulses for programming a phase change element to a selected resistance state.

FIG. 11C is a graph 300c illustrating another embodiment of write pulses for programming a phase change element to a selected resistance state. Graph 300c illustrates multiple write pulses to use in place of write pulse 282e previously described and illustrated with reference to FIG. 10B. The multiple write pulses program a phase change element to a partially crystalline and partially amorphous state as illustrated at 200b in FIG. 3. First, a write pulse 302 is applied to the phase change material. Next, step function 283a illustrated in FIG. 10B is replaced with a series of pulses 308a, 308b, and 308c, which provide a similar temperature profile to second temperature profile 272e illustrated in FIG. 10A.

Figure 11D:
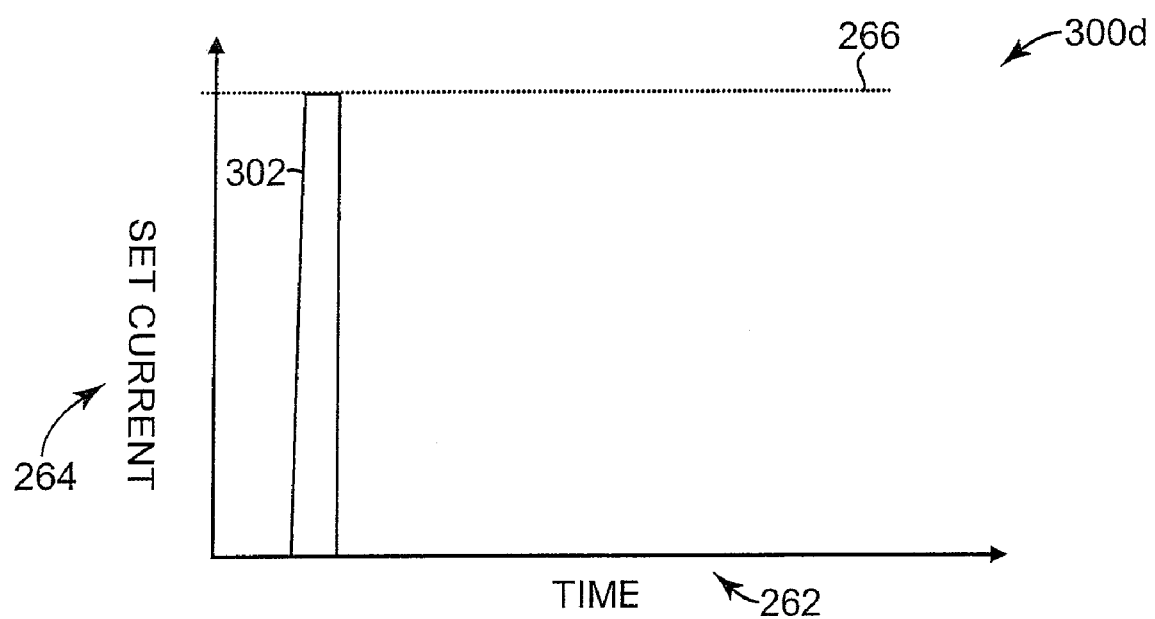
FIG. 11D is a graph illustrating another embodiment of a write pulse for programming a phase change element to a selected resistance state.

FIG. 11D is a graph 300d illustrating another embodiment of a write pulse for programming a phase change element to a selected resistance state. Graph 300d illustrates a write pulse to use in place of write pulse 268 illustrated in FIG. 10B. The write pulse programs a phase change element to a substantially amorphous state as illustrated at 200a in FIG. 3. Write pulse 302 is applied to the phase change material and provides a similar temperature profile to first temperature profile 252 illustrated in FIG. 10A.

Figure 12A:
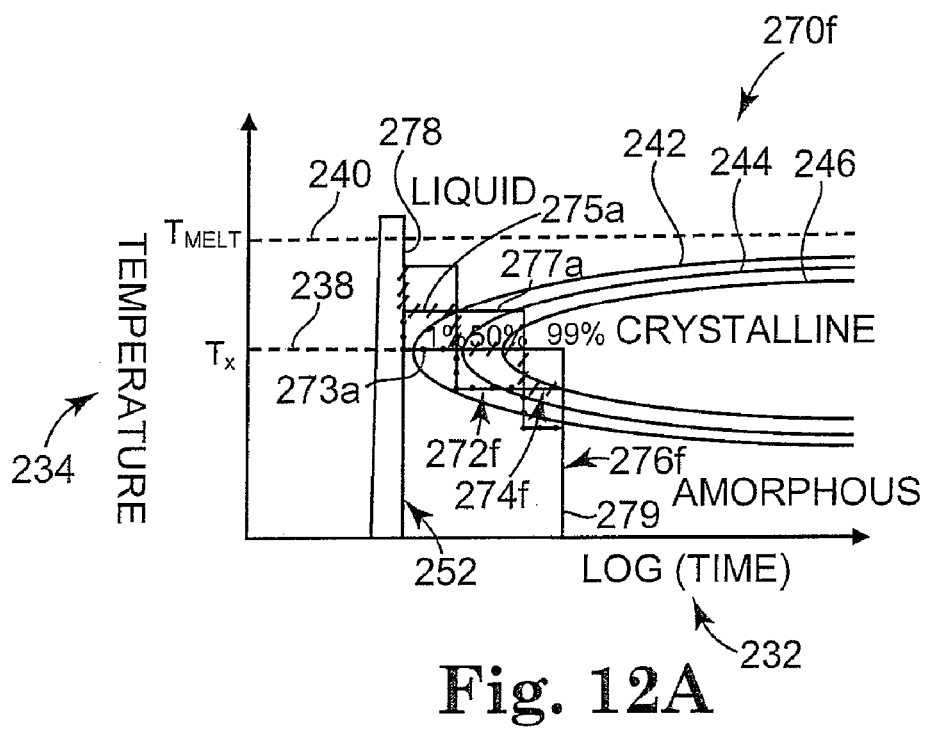
FIG. 12A is a graph illustrating another embodiment of temperature profiles for programming a phase change element to a selected one of four resistance states.

FIG. 12A is a graph 270f illustrating another embodiment of temperature profiles for programming a phase change element to a selected one of four resistance states. Graph 270f includes first temperature profile 252, a second temperature profile 272f, a third temperature profile 274f, and a fourth temperature profile 276f. First temperature profile 252 was previously described and illustrated with reference to FIG. 5A.

Second temperature profile 274f is similar to second temperature profile 272c previously described and illustrated with reference to FIG. 8A, except that gradient portion 273a of second temperature profile 272f is approximated by a step function. The step function can include any suitable number of steps, such as any number of steps between two and fifty. Step function portion 273a programs the phase change material to the partially crystalline and partially amorphous state as illustrated at 200b in FIG. 3.

Likewise, third temperature profile 274f is similar to third temperature profile 274c previously described and illustrated with reference to FIG. 8A, except that gradient portion 275a of third temperature profile 274f is approximated by a step function. Step function portion 275a programs the phase change material to the partially crystalline and partially amorphous state as illustrated at 200c in FIG. 3.

Likewise, fourth temperature profile 276f is similar to fourth temperature profile 276c previously described and illustrated with reference to FIG. 8A, except that gradient portion 277a of fourth temperature profile 276f is approximated by a step function. Step function portion 277a programs the phase change material to the substantially crystalline state as illustrated at 200d in FIG. 3.

Step function portion 275a of third temperature profile 274f falls below $T_X$ 238 after step function portion 273a of second temperature profile 272f falls below $T_X$ 238. Step function portion 277a of fourth temperature profile 276f falls below $T_X$ 238 after step function portion 275a of third temperature profile 274f falls below $T_X$ 238. Therefore, third temperature profile 274f crystallizes more phase change material than second temperature profile 272f, and fourth temperature profile 276f crystallizes more phase change material than third temperature profile 274f. In this way, third temperature profile 274f programs the phase change material to a lower resistance state than second temperature profile 272f, and fourth temperature profile 276f programs the phase change material to a lower resistance state than third temperature profile 274f.

Figure 12B:
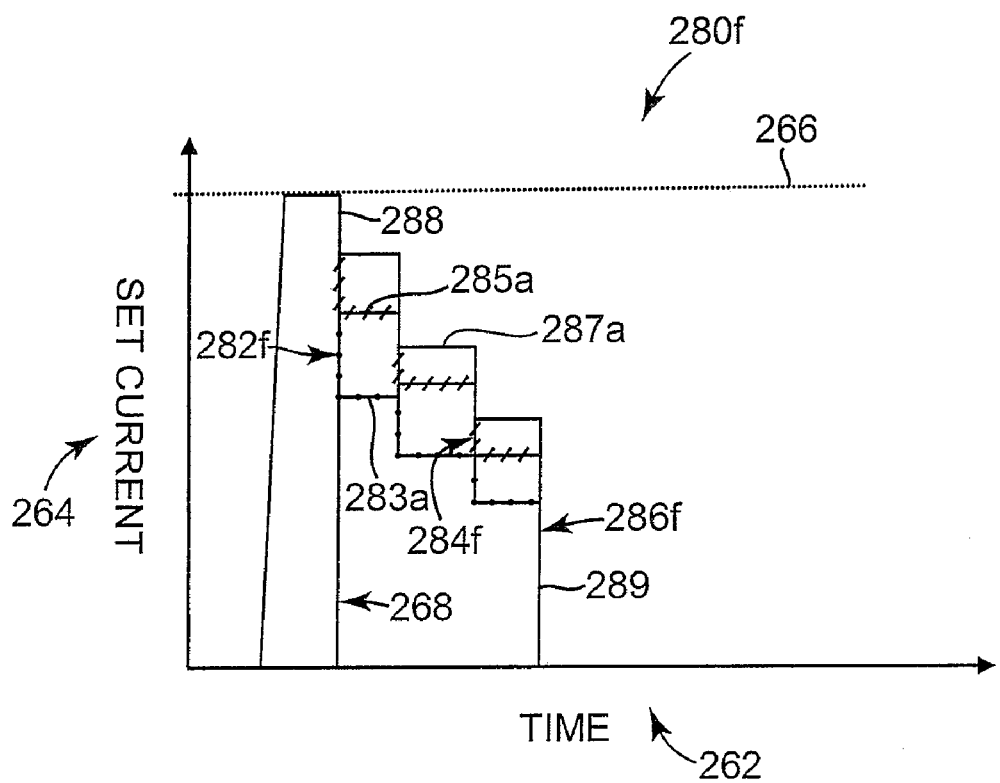
FIG. 12B is a graph illustrating another embodiment of write pulses for programming a phase change element to a selected one of four resistance states.

FIG. 12B is a graph 280f illustrating another embodiment of write pulses for programming a phase change element to a selected one of four resistance states. Graph 280f includes first write pulse 268, a second write pulse 282f, a third write pulse 284f, and a fourth write pulse 286f. First write pulse 268 was previously described and illustrated with reference to FIG. 5B. Second write pulse 282f provides second temperature profile 272f, third write pulse 284f provides third temperature profile 274f, and fourth write pulse 286f provides fourth temperature profile 276f as previously described and illustrated with reference to FIG. 12A.

Second write pulse 282f is similar to second pulse 282c previously described and illustrated with reference to FIG. 8B, except that gradient portion 283a of second write pulse 282f is approximated by a step function. The step function can include any suitable number of steps, such as any number of steps between two and fifty. Step function portion 283a gradually steps down the current to provide step function portion 273a of second temperature profile 272f illustrated in FIG. 12A.

Likewise, third write pulse 284f is similar to third write pulse 284c previously described and illustrated with reference to FIG. 8B, except that gradient portion 285a of third write pulse 284f is approximated by a step function. Step function portion 285a gradually steps down the current at a rate less than step function portion 283a of second write pulse 282f to provide step function portion 275a of third temperature profile 274f illustrated in FIG. 12A.

Likewise, fourth write pulse 286f is similar to fourth write pulse 286c previously described and illustrated with reference to FIG. 8B, except that gradient portion 287a of fourth write pulse 286f is approximated by a step function. Step function portion 287a gradually steps down the current at a rate less than step function portion 285a of third write pulse 284f to provide step function portion 277a of fourth temperature profile 276f illustrated in FIG. 12A. In another embodiment, write pulses 282f, 284f, and 286f are each replaced with a series of pulses as previously described and illustrated with reference to FIG. 11A-11D. In this way, the phase change material is programmed to the selected one of four resistance states.

Figure 13A:
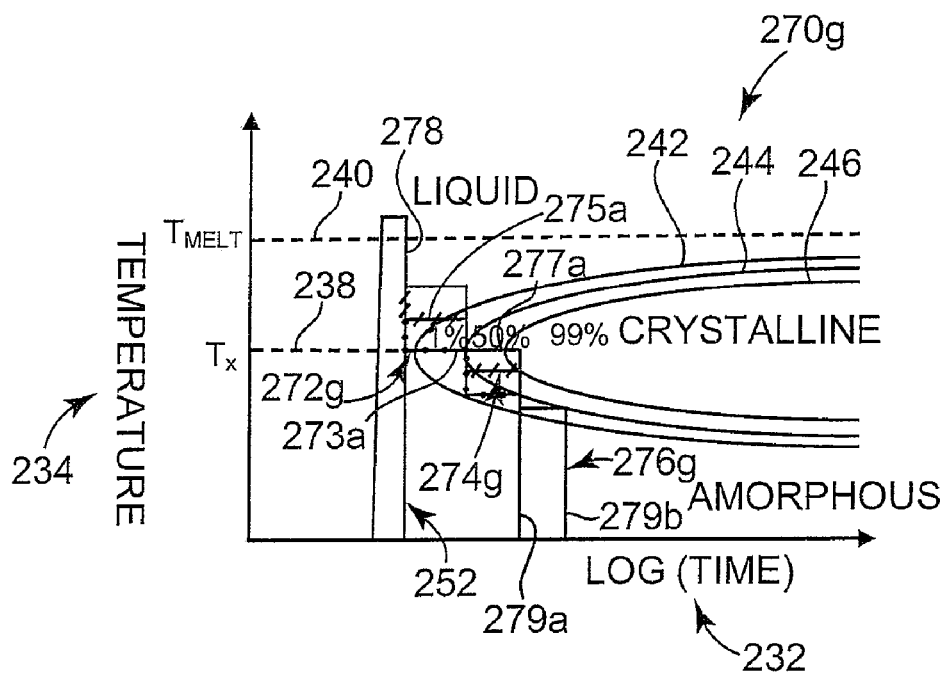
FIG. 13A is a graph illustrating another embodiment of temperature profiles for programming a phase change element to a selected one of four resistance states.

FIG. 13A is a graph 270g illustrating another embodiment of temperature profiles for programming a phase change element to a selected one of four resistance states. Graph 270g includes first temperature profile 252, a second temperature profile 272g, a third temperature profile 274g, and a fourth temperature profile 276g. First temperature profile 252 was previously described and illustrated with reference to FIG. 5A.

Second temperature profile 274g is similar to second temperature profile 272d previously described and illustrated with reference to FIG. 9A, except that gradient portion 273a of second temperature profile 272g is approximated by a step function. The step function can terminate with step portion 279a or 279b. The step function can include any suitable number of steps, such as any number of steps between two and fifty. Step function portion 273a programs the phase change material to the partially crystalline and partially amorphous state as illustrated at 200b in FIG. 3.

Likewise, third temperature profile 274g is similar to third temperature profile 274d previously described and illustrated with reference to FIG. 9A, except that gradient portion 275a of third temperature profile 274g is approximated by a step function. The step function can terminate with step portion 279a or 279b. Step function portion 275a programs the phase change material to the partially crystalline and partially amorphous state as illustrated at 200c in FIG. 3.

Likewise, fourth temperature profile 276g is similar to fourth temperature profile 276d previously described and illustrated with reference to FIG. 9A, except that gradient portion 277a of fourth temperature profile 276g is approximated by a step function. The step function can terminate with step portion 279a or 279b. Step function portion 277a programs the phase change material to the substantially crystalline state as illustrated at 200d in FIG. 3.

Step function portion 275a of third temperature profile 274g falls below $T_X$ 238 after step function portion 273a of second temperature profile 272g falls below $T_X$ 238. Step function portion 277a of fourth temperature profile 276g falls below $T_X$ 238 after step function portion 275a of third temperature profile 274g falls below $T_X$ 238. Therefore, third temperature profile 274g crystallizes more phase change material than second temperature profile 272g, and fourth temperature profile 276g crystallizes more phase change material than third temperature profile 274g. In this way, third temperature profile 274g programs the phase change material to a lower resistance state than second temperature profile 272g, and fourth temperature profile 276g programs the phase change material to a lower resistance state than third temperature profile 274g.

Figure 13B:
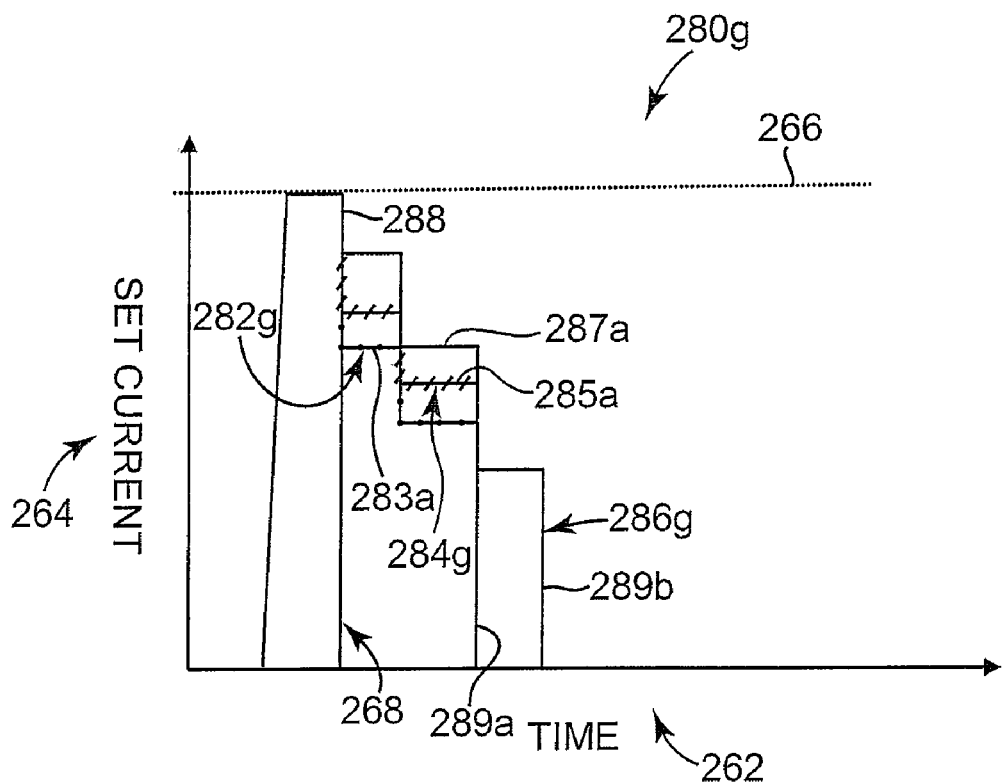
FIG. 13B is a graph illustrating another embodiment of write pulses for programming a phase change element to a selected one of four resistance states.

FIG. 13B is a graph 280g illustrating another embodiment of write pulses for programming a phase change element to a selected one of four resistance states. Graph 280g includes first write pulse 268, a second write pulse 282g, a third write pulse 284g, and a fourth write pulse 286g. First write pulse 268 was previously described and illustrated with reference to FIG. 5B. Second write pulse 282g provides second temperature profile 272g, third write pulse 284g provides third temperature profile 274g, and fourth write pulse 286g provides fourth temperature profile 276g as previously described and illustrated with reference to FIG. 13A.

Second write pulse 282g is similar to second write pulse 282d previously described and illustrated with reference to FIG. 9B, except that gradient portion 283a of second write pulse 282g is approximated by a step function. The step function can terminate with step portion 289a or 289b. The step function can include any suitable number of steps, such as any number of steps between two and fifty. Step function portion 283a gradually steps down the current to provide step function portion 273a of second temperature profile 272g illustrated in FIG. 13A.

Likewise, third write pulse 284g is similar to third write pulse 284d previously described and illustrated with reference to FIG. 9B, except that gradient portion 285a of third write pulse 284g is approximated by a step function. The step function can terminate with step portion 289a or 289b. Step function portion 285a gradually steps down the current at a rate greater than step function portion 283a of second write pulse 282g to provide step function portion 275a of third temperature profile 274g illustrated in FIG. 13A.

Likewise, fourth write pulse 286g is similar to fourth write pulse 286d previously described and illustrated with reference to FIG. 9B, except that gradient portion 287a of fourth write pulse 286g is approximated by a step function. The step function can terminate with step portion 289a or 289b. Step function portion 287a gradually steps down the current at a rate greater than step function portion 285a of third write pulse 284g to provide step function portion 277a of fourth temperature profile 276g illustrated in FIG. 13A. In another embodiment, write pulses 282g, 284g, and 286g are each replaced with a series of pulses as previously described and illustrated with reference to FIG. 11A-11D. In this way, the phase change material is programmed to the selected one of three resistance states.

Embodiments provide multi-bit phase change memory cells programmed by varying a tail portion of a write pulse applied to each phase change memory cell. In one embodiment, each tail portion of each write pulse includes a gradient or step function approximating the gradient to control the amount of crystallized and amorphous phase change material. In another embodiment, the step function can be provided by a series of pulses.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
   a memory element configured to be programmed to any one of at least three resistance states; and
   a circuit configured to program the memory element to a selected one of the at least three resistance states by applying a pulse to the memory element, the pulse including one of at least three tail portions wherein each tail portion corresponds to one of the at least three resistance states,
   wherein one of the at least three tail portions is less than 3 ns.

2. The integrated circuit of claim 1, wherein each of the at least three tail portions falls below a crystallization temperature of the memory element at a different time.

3. The integrated circuit of claim 1, wherein at least two of the at least three tail portions includes a negative step function.

4. The integrated circuit of claim 1, wherein each of the at least three tail portions includes a negative gradient.

5. The integrated circuit of claim 1, wherein at least two of the at least three tail portions begins at a single current.

6. The integrated circuit of claim 1, wherein at least two of the at least three tail portions begins at a different current.

7. The integrated circuit of claim 1, wherein at least two of the at least three tail portions ends at a same time.

8. The integrated circuit of claim 1, wherein at least two of the at least three tail portions ends at a different time.

9. The integrated circuit of claim 1, wherein the memory element comprises a phase change material.

10. The integrated circuit of claim 9, wherein one of the at least three tail portions programs the phase change material to a substantially amorphous state.

11. A system comprising:
    a host; and
    a memory device communicatively coupled to the host, the memory device comprising:
      a phase change element configured to be programmed to any one of at least three resistance states; and
      a write circuit configured to program the memory element to a selected one of the at least three resistance states by applying a pulse to the memory element, the pulse including one of at least three tail portions wherein each tail portion corresponds to one of the at least three resistance states,
      wherein one of the at least three tail portions is less than 3 ns.

12. The system of claim 11, wherein each tail portion stays within a crystallization temperature range of the phase change element for a different amount of time.

13. The system of claim 11, wherein at least two tail portions comprise a negative step function.

14. The system of claim 11, wherein each tail portion comprises a negative gradient.

15. The system of claim 11, wherein one of the at least three tail portions programs the phase change element to a substantially amorphous state.

16. The system of claim 11, wherein the memory device further comprises:
    a sense circuit configured to read a resistance state of the phase change element; and
    a controller configured to control the write circuit and the sense circuit.

17. A memory comprising:
    a multi-bit phase change element; and
    means for programming the phase change element to a selected one of at least three resistance states by applying one series of at least two series of descending pulses to the phase change element, each series of descending pulses corresponding to one of the at least three resistance states,
    wherein a delay between each pulse in each series of descending pulses in less than 10 ns.

18. The memory of claim 17, further comprising:
    means for programming the phase change element to a first resistance state by applying a single pulse to the phase change element.

19. The memory of claim 17, wherein each series of descending pulses falls below a crystallization temperature of the phase change element at a different time.

20. The memory of claim 17, wherein each series of descending pulses provides a negative step function temperature profile.

21. A method for programming a memory element, the method comprising:
    providing a memory element configured to be programmed to any one of at least three resistance states; and
    applying a pulse to the memory element to program the memory element to a selected one of the at least three resistance states, the pulse including one of at least three tail portions wherein each tail portion corresponds to one of the at least three resistance states,
    wherein one of the at least three tail portions is less than 3 ns.

22. The method of claim 21, wherein applying the pulse comprises applying a pulse including one of at least three tail portions wherein each tail portion falls below a crystallization temperature of the memory element at a different time.

23. The method of claim 21, wherein applying the pulse comprises applying a pulse including one of at least three tail portions wherein at least two tail portions include a negative step function.

24. The method of claim 21, wherein applying the pulse comprises applying a pulse including one of at least three tail portions wherein at least two tail portions include a negative gradient.

25. The method of claim 21, wherein providing the memory element comprises providing a phase change element.

26. A method for programming a memory element, the method comprising:
    providing a memory element configured to be programmed to any one of at least three resistance states; and
    applying one series of at least three series of descending pulses to the memory element to program the memory element to a selected one of the at least three resistance states, wherein each series comprises between two and fifty descending pulses.

27. The method of claim 26, further comprising:
    applying a single pulse to the memory element to program the memory element to a first resistance state.

28. The method of claim 26, wherein applying one series of the at least three series of descending pulses comprises applying one series of the at least three series of descending pulses to the memory element to provide a negative step function temperature profile.

29. The method of claim 26, wherein providing the memory element comprises providing a phase change element.